(12) United States Patent
Eroz et al.

(10) Patent No.: US 9,294,131 B2
(45) Date of Patent: *Mar. 22, 2016

(54) APPARATUS AND METHOD FOR IMPROVED MODULATION AND CODING SCHEMES FOR BROADBAND SATELLITE COMMUNICATIONS SYSTEMS

(71) Applicant: Hughes Network Systems, LLC, Germantown, MD (US)

(72) Inventors: Mustafa Eroz, Germantown, MD (US); Lin-Nan Lee, Potomac, MD (US)

(73) Assignee: Hughes Network Systems, LLC, Germantown, MD (US)

( * ) Notice: Subject to any disclaimer, the term of this patent is extended or adjusted under 35 U.S.C. 154(b) by 45 days.

This patent is subject to a terminal disclaimer.

(21) Appl. No.: 13/933,774

(22) Filed: Jul. 2, 2013

(65) Prior Publication Data

US 2014/0229802 A1    Aug. 14, 2014

Related U.S. Application Data

(63) Continuation-in-part of application No. 13/890,643, filed on May 9, 2013, which is a continuation-in-part of application No. 13/763,723, filed on Feb. 10, 2013, now Pat. No. 8,887,024.

(51) Int. Cl.
*H03M 13/00* (2006.01)
*H03M 13/13* (2006.01)
(Continued)

(52) U.S. Cl.
CPC .......... *H03M 13/13* (2013.01); *H03M 13/1165* (2013.01); *H03M 13/255* (2013.01); *H03M 13/271* (2013.01); *H03M 13/2906* (2013.01); *H04L 1/00* (2013.01); *H03M 13/152* (2013.01)

(58) Field of Classification Search
CPC ............ H03M 13/13; H03M 13/1165; H03M 13/152; H03M 13/255; H03M 13/271; H03M 13/2906

USPC .................................. 714/776, 752, 755, 758
See application file for complete search history.

(56) References Cited

U.S. PATENT DOCUMENTS

| 5,805,642 A | 9/1998 | Wei et al. |
| 5,838,728 A | 11/1998 | Alamouti et al. |

(Continued)

FOREIGN PATENT DOCUMENTS

| EP | WO 2004/006442 A1 | 1/2004 |
| EP | 1387496 A2 | 2/2004 |
| EP | 2365639 A2 | 9/2011 |

OTHER PUBLICATIONS

Eroz, Mustafa et al., "An Innovative Low-Density Parity-Check Code Design With Near-Shannon-Limit Performance and Simple Implementation", IEEE Transactions on Communications, vol. 54, No. 1, Jan. 1, 2006, XPOQ7902266, 13-17.

(Continued)

*Primary Examiner* — Sam Rizk
(74) *Attorney, Agent, or Firm* — Potomac Technology Law, LLC

(57) ABSTRACT

Modulation and coding schemes are provided for improved performance of wireless communications systems to support services and applications for terminals with operational requirements at relatively low $E_S/N_0$ ratios. The provided modulation and coding schemes will support current and future communications services and applications for terminals with operational requirements at relatively low $E_S/N_0$ ratios, and will provide modulation and coding schemes that offer finer granularity within an intermediate operational range of $E_S/N_0$ ratios. The new modulation and coding schemes provide new BCH codes, and low density parity check (LDPC) codes.

14 Claims, 11 Drawing Sheets

(51) Int. Cl.
  *H03M 13/11* (2006.01)
  *H03M 13/25* (2006.01)
  *H03M 13/27* (2006.01)
  *H03M 13/29* (2006.01)
  *H04L 1/00* (2006.01)
  *H03M 13/15* (2006.01)

(56) References Cited

U.S. PATENT DOCUMENTS

| | | | |
|---|---|---|---|
| 5,844,943 | A | 12/1998 | Kazecki et al. |
| 5,903,609 | A | 5/1999 | Kool et al. |
| 6,023,783 | A | 2/2000 | Divsalar et al. |
| 6,097,764 | A | 8/2000 | McCallister et al. |
| 6,104,761 | A | 8/2000 | McCallister et al. |
| 6,157,621 | A | 12/2000 | Brown et al. |
| 6,430,722 | B1 | 8/2002 | Eroz et al. |
| 6,529,495 | B1 | 3/2003 | Aazhang et al. |
| 6,674,811 | B1 | 1/2004 | Desrosiers et al. |
| 6,724,813 | B1 | 4/2004 | Jamal et al. |
| 6,829,308 | B2 | 12/2004 | Eroz et al. |
| 6,940,827 | B2 | 9/2005 | Li et al. |
| 6,963,622 | B2 | 11/2005 | Eroz et al. |
| 7,020,829 | B2 | 3/2006 | Eroz et al. |
| 7,039,126 | B2 | 5/2006 | Galins |
| 7,173,978 | B2 | 2/2007 | Zhang et al. |
| 7,187,728 | B2 | 3/2007 | Seier et al. |
| 7,191,378 | B2 | 3/2007 | Eroz et al. |
| 7,203,887 | B2 | 4/2007 | Eroz et al. |
| 7,234,098 | B2 | 6/2007 | Eroz et al. |
| 7,237,174 | B2 | 6/2007 | Eroz et al. |
| 7,296,208 | B2 | 11/2007 | Sun et al. |
| 7,324,613 | B2 | 1/2008 | Fang et al. |
| 7,334,181 | B2 | 2/2008 | Eroz et al. |
| 7,376,883 | B2 | 5/2008 | Eroz et al. |
| 7,398,455 | B2 | 7/2008 | Eroz et al. |
| 7,424,662 | B2 | 9/2008 | Eroz et al. |
| 7,430,396 | B2 | 9/2008 | Sun et al. |
| 7,447,984 | B2 | 11/2008 | Cameron et al. |
| 7,461,325 | B2 | 12/2008 | Eroz et al. |
| 7,483,496 | B2 | 1/2009 | Eroz et al. |
| 7,577,207 | B2 | 8/2009 | Eroz et al. |
| 7,673,226 | B2 | 3/2010 | Eroz et al. |
| 7,725,802 | B2 | 5/2010 | Eroz et al. |
| 7,746,758 | B2 | 6/2010 | Stolpman |
| 7,770,089 | B2 | 8/2010 | Eroz et al. |
| 7,856,586 | B2 | 12/2010 | Eroz et al. |
| 7,864,869 | B2 | 1/2011 | Eroz et al. |
| 7,954,036 | B2 | 5/2011 | Eroz et al. |
| 7,962,830 | B2 | 6/2011 | Eroz et al. |
| 8,028,224 | B2 | 9/2011 | Eroz et al. |
| 8,069,393 | B2 | 11/2011 | Eroz et al. |
| 8,095,854 | B2 | 1/2012 | Eroz et al. |
| 8,102,947 | B2 | 1/2012 | Eroz et al. |
| 8,126,076 | B2 | 2/2012 | Sartori et al. |
| 8,140,931 | B2 | 3/2012 | Eroz et al. |
| 8,144,801 | B2 | 3/2012 | Eroz et al. |
| 8,145,980 | B2 | 3/2012 | Eroz et al. |
| 8,156,400 | B1 | 4/2012 | Yeo et al. |
| 8,181,085 | B2 | 5/2012 | Eroz et al. |
| 8,291,293 | B2 | 10/2012 | Eroz et al. |
| 8,369,448 | B2 | 2/2013 | Zhang et al. |
| 8,392,786 | B2 | 3/2013 | Trachewsky et al. |
| 8,402,341 | B2 | 3/2013 | Eroz et al. |
| 8,782,499 | B2 | 7/2014 | Jeong et al. |
| 2003/0002593 | A1 | 1/2003 | Galins |
| 2003/0021358 | A1 | 1/2003 | Galins |
| 2003/0037298 | A1 | 2/2003 | Eleftheriou et al. |
| 2004/0019845 | A1 | 1/2004 | Eroz et al. |
| 2004/0054960 | A1 | 3/2004 | Eroz et al. |
| 2004/0258177 | A1 | 12/2004 | Shen et al. |
| 2005/0111590 | A1 | 5/2005 | Fang et al. |
| 2006/0218459 | A1 | 9/2006 | Hedberg |
| 2006/0224935 | A1 | 10/2006 | Cameron et al. |
| 2008/0019263 | A1 | 1/2008 | Stolpman |
| 2008/0313523 | A1 | 12/2008 | Sun et al. |
| 2009/0158129 | A1 | 6/2009 | Myung et al. |
| 2009/0187804 | A1 | 7/2009 | Shen et al. |
| 2009/0219849 | A1 | 9/2009 | Alpert et al. |
| 2010/0100789 | A1 | 4/2010 | Yu et al. |
| 2010/0122143 | A1 | 5/2010 | Lee et al. |
| 2010/0211841 | A1 | 8/2010 | Cao et al. |
| 2011/0051825 | A1 | 3/2011 | Tao et al. |
| 2011/0164705 | A1 | 7/2011 | Zhang et al. |
| 2011/0202820 | A1 | 8/2011 | Eroz et al. |
| 2011/0239086 | A1 | 9/2011 | Eroz et al. |
| 2013/0198581 | A1 | 8/2013 | Lee et al. |
| 2013/0283131 | A1 | 10/2013 | Tsatsaragkos et al. |
| 2014/0068375 | A1 | 3/2014 | Eroz et al. |

OTHER PUBLICATIONS

Eroz, Mustafa et al., "Structured Low-Density Parity-Check Code Design for Next Generation Digital Video Broadcast", Military Communications Conference, 2005, Oct. 17, 2005, XP010901536, 1-6.
ESR P1064EP00, , "European Search Report", EP 2365639 A3, Aug. 1, 2012.
ETSI EN 302 307 V1.2.1 (DVB), "ETSI EN 302 307 V1.2.1 Digital Video Broadcasting (DVB); Second generation framing structure, channel coding and modulation systems for Broadcasting, Interactive Services, News Gathering and other broadband satellite applications (DVB-S2)", ETSI EN 302 307 V1.2.1, Aug. 1, 2009, XP002678089, 22-28, 37-49.

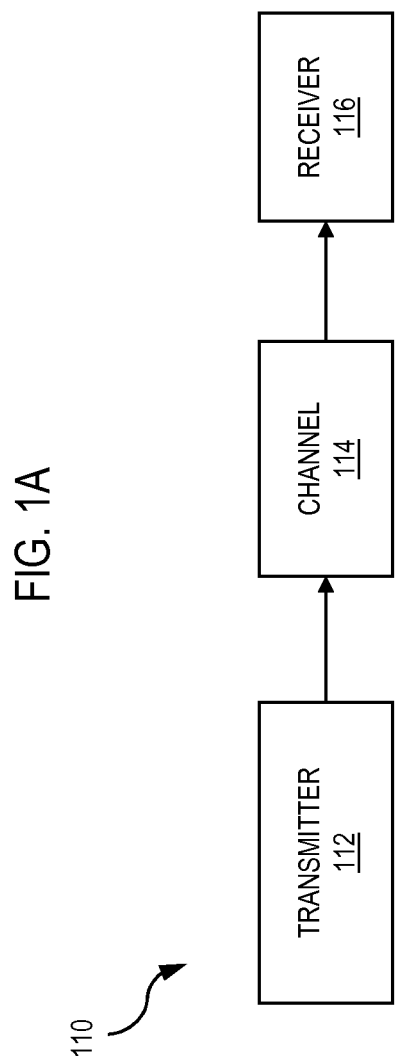

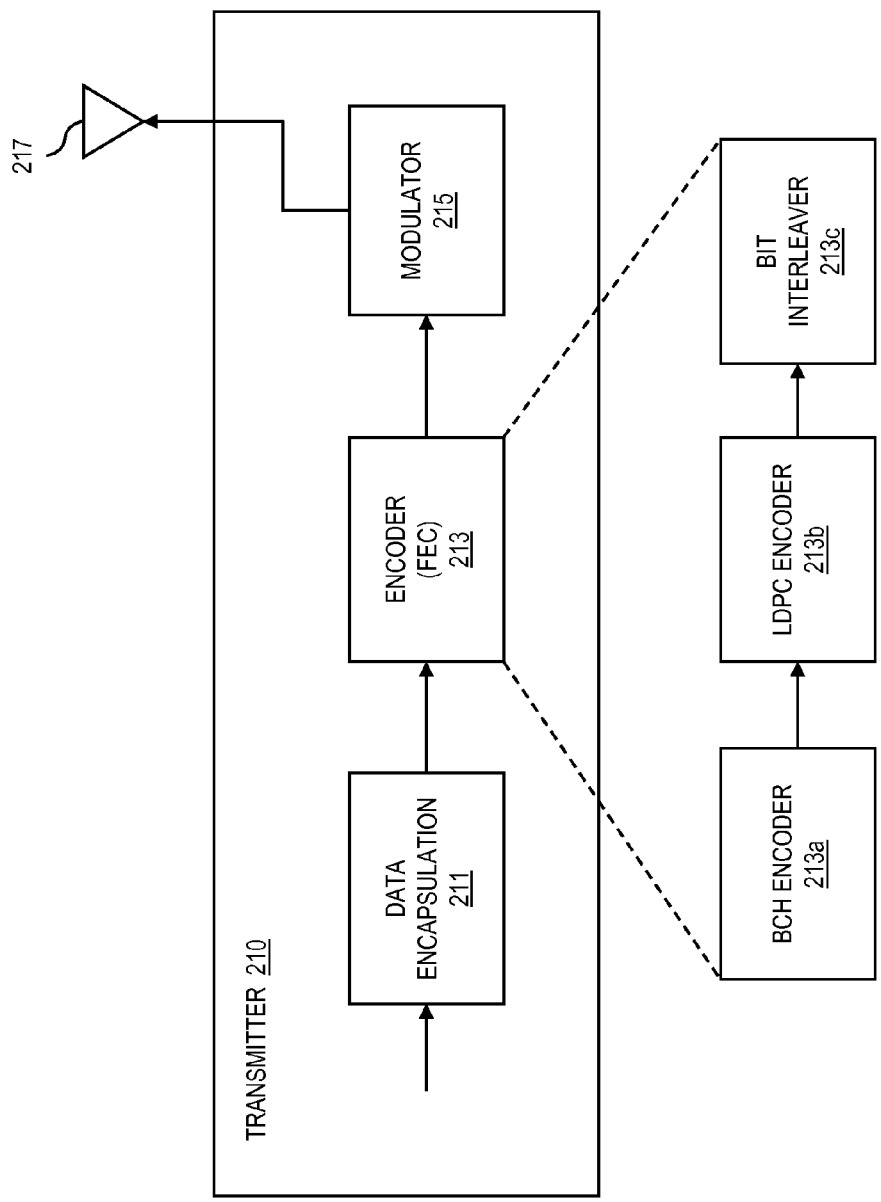

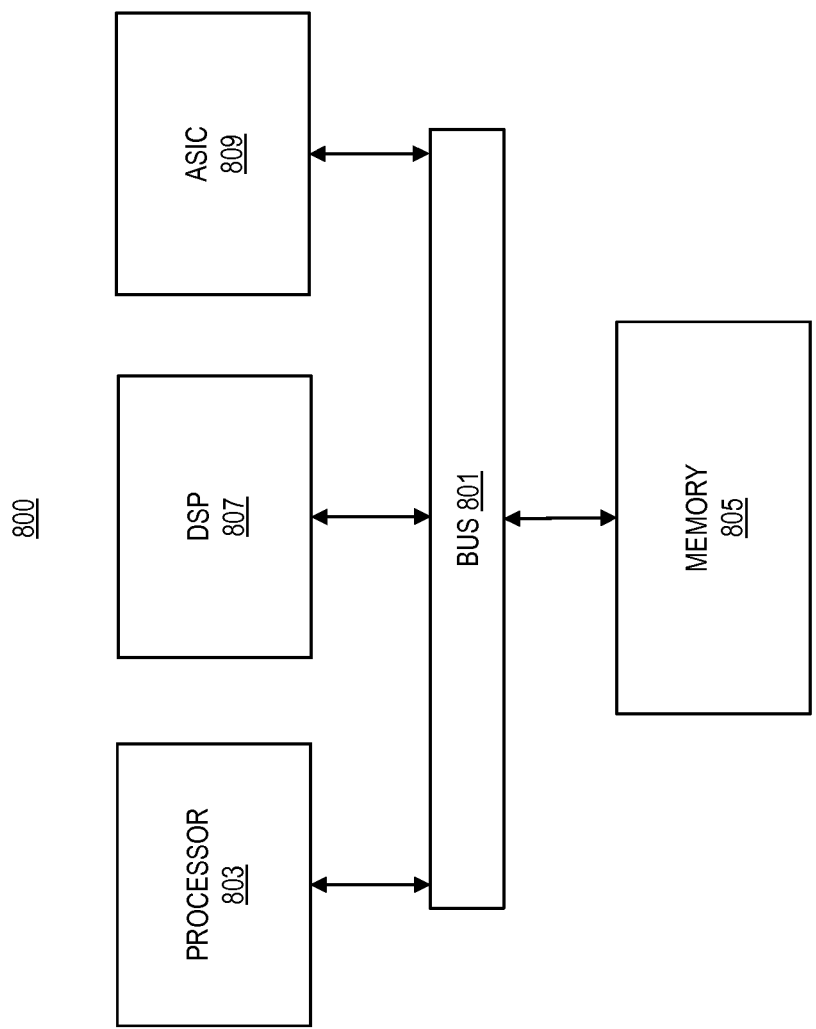

APPARATUS AND METHOD FOR IMPROVED MODULATION AND CODING SCHEMES FOR BROADBAND SATELLITE COMMUNICATIONS SYSTEMS

RELATED APPLICATIONS

This application is a Continuation-In-Part (CIP) of co-pending U.S. patent application Ser. No. 13/890,643 (filed 9 May 2013), which is a Continuation-In-Part (CIP) of co-pending U.S. patent application Ser. No. 13/763,723 (filed 10 Feb. 2013), the entireties of which are incorporated herein by reference.

BACKGROUND

Over recent decades, developments in data communications technologies have continued to provide enhanced multimedia services (e.g., voice, data, video, etc.) to end-users. Such communications technologies encompass various delivery platforms, including terrestrial wire-line, fiber and wireless communications and networking technologies, and satellite communications and networking technologies. Further, in recent years, the proliferation of mobile communications has spurred an exponential growth in the provision of such enhanced multimedia services over mobile communications networks (both terrestrial and satellite based). As part of the continued evolution of such communications platforms and supporting technologies, the Digital Video Broadcasting (DVB) organization was formed (as an industry-led, global consortium of broadcasters, manufacturers, network operators, software developers, regulatory bodies and others) to advance the design of open interoperable standards for the global delivery of digital media and broadcast services.

As part of the standardization process for digital media and broadcast services, the DVB organization managed the adoption and publication of the DVB-S2 standard via recognized standards setting organizations (e.g., ETSI and TIA). DVB-S2 is a digital satellite transmission system standard covering framing structure, channel coding and modulation systems, designed for broadcast services (for standard and high definition television), interactive services (e.g., Internet access for consumer applications), and other broadband satellite applications. DVB-S2 represents a flexible standard, covering a variety of data and multimedia services delivered over satellite communications systems. The DVB-S2 standard covers various technological features, such as a flexible input stream adapter (suitable for operation with single and multiple input streams of various formats), a robust forward error correction coding (FEC) system based on low-density parity check (LDPC) codes concatenated with Bose Chaudhuri Hocquenghem (BCH) codes, a wide range of code rates (from ¼ up to 9/10), four signal constellations (ranging in spectrum efficiency from 2 bit/s/Hz to 5 bit/s/Hz), and adaptive coding and modulation (ACM) functionality (optimizing channel coding and modulation on a frame-by-frame basis).

Since its inception, the DVB-S2 standard has been adopted globally as a predominant standard for broadcast, interactive and other broadband applications and services over satellite communications networks. Currently, there are applications and services for terminals, particularly in the field of mobile communications, that require operation at lower signal-to-noise ratios ($E_S/N_0$), down to approximately −9 dB to −10 dB. The current modulation and coding schemes (e.g., the modulation and coding schemes of the DVB-S2 standard), however, support operation down to $E_S/N_0$ ratios of only about −3 dB, and thus are unable to support the operational requirements for such current mobile and other low signal-to-noise ratio (SNR) terminals (e.g., below −3 dB). Further, the modulation and coding schemes of the current DVB-S2 standard ($E_S/N_0$ ratios within the range of approximately −3 dB to 15.5 dB) lack sufficient granularity to meet the requirements of terminals in the growing field of broadcast, interactive and other broadband applications and services over satellite communications networks.

What is needed, therefore, are systems and methods for providing modulation and coding schemes that support current and future communications services and applications for terminals with operational requirements at relatively low SNR and terminals, and to provide modulation and coding schemes that offer finer granularity (among existing modulation and coding schemes) within an intermediate operational range.

SOME EXEMPLARY EMBODIMENTS

The present invention advantageously addresses the foregoing requirements and needs, as well as others, by providing a system and methods for providing modulation and coding schemes that support current and future communications services and applications for terminals with operational requirements at relatively low $E_S/N_0$ ratios (e.g., within the operational range of approximately −3 dB to −10 dB), and to provide modulation and coding schemes that offer finer granularity within an intermediate operational range of $E_S/N_0$ ratios (e.g., approximately −3 dB to 15.5 dB).

According to an exemplary embodiment, a method comprises encoding, by a processor of a device, a source data sequence of information bits based on a predetermined structured parity check matrix of a Low Density Parity Check (LDPC) code, wherein the encoding is performed based on frames of the source data sequence, each frame being of a length of $k_{ldpc}$ information bits ($i_0, i_1, \ldots, i_{k_{ldpc}-1}$), and the output of the encoding comprises coded LDPC frames each being $n_{ldpc}$ coded bits in length. The structured parity check matrix is represented by tabular information (a code table) of a format wherein each row represents occurrences of one values within a respective column of the parity check matrix, and the columns of the parity check matrix are derived according to a predetermined operation based on the respective rows of the tabular information, and wherein the code table comprises one of a selection of new LDPC code designs (each represented by a respective code table). According to the method, the encoding wherein the encoding comprises generating $n_{ldpc}-k_{ldpc}$ parity bits ($p_0, p_1, \ldots, p_{n_{ldpc}-k_{ldpc}-1}$) for each frame of the source data sequence, wherein the generation of the parity bits comprises: initializing parity bit accumulators for $p_0, p_1, \ldots, p_{n_{ldpc}-k_{ldpc}-1}$ to zero; accumulating information bit $i_0$ at parity bit accumulator addresses specified in the first row of the table; for the next group of m−1 information bits, $i_y$ (y=1, 2, ..., m−1), accumulating each information bit at parity bit accumulator addresses {x+(y mod m)*q} mod($n_{ldpc}-k_{ldpc}$), wherein x denotes an address of a parity bit accumulator corresponding to the information bit $i_0$, and q is a code-rate dependent constant (q=($n_{ldpc}$−k)/m), and wherein m is a code-dependent constant and k=R*n (where R is the code rate); accumulating $i_m$ at parity bit accumulator addresses specified in the second row of the table, and, in a similar manner as for the group of m−1 information bits (above), accumulating each information bit of the next group of m−1 information bits $i_z$, z=(m+1, m+2, ..., 2m) at {x+(z mod m)*q} mod($n_{ldpc}-k_{ldpc}$), wherein x denotes the address of the parity bit accumulator corresponding to the information bit $i_m$ (the entries of the second row of the table); in a similar manner, for each subsequent group of m information bits, accumulating the information bits at parity bit addresses based on a next row of the table; and after all of the information bits of the frame are accumulated, performing operations according to $p_i=p_i \oplus p_{i-1}$, wherein for i=1, 2, ..., $(n_{ldpc}-k_{ldpc}-1)$, each $p_i$ resulting from the operation for a given i is equal to the parity bit $p_i$.

According to a further exemplary embodiment, the method further comprises modulating the coded FEC frames according to a selected modulation scheme, wherein the selected modulation scheme comprises one of the following modulation types: π/2 BPSK (Binary Phase Shift Keying), QPSK (Quadrature Phase Shift Keying), 8-PSK (Phase Shift Keying), 16-APSK (Amplitude Phase Shift Keying), and 32-APSK, wherein, in the case of π/2 BPSK or QPSK, the coded FEC frames are not interleaved.

Still other aspects, features, and advantages of the present invention are readily apparent from the following detailed description, simply by illustrating a number of particular embodiments and implementations, including the best mode contemplated for carrying out the present invention. The present invention is also capable of other and different embodiments, and its several details can be modified in various obvious respects, all without departing from the spirit and scope of the present invention. Accordingly, the drawing and description are to be regarded as illustrative in nature, and not as restrictive.

BRIEF DESCRIPTION OF THE DRAWINGS

The present invention is illustrated by way of example, and not by way of limitation, in the figures of the accompanying drawings and in which like reference numerals refer to similar elements and in which:

FIG. 1A illustrates a communications system capable of employing modulation and coding protocols, in accordance with exemplary embodiments of the present invention;

FIG. 2A illustrates a block diagram of an exemplary transmitter configured to operate in the systems of FIGS. 1A and 1B, in accordance with exemplary embodiments of the present invention;

FIG. 8 illustrates a block diagram of a chip set that can be utilized in implementing communications system protocols, according to exemplary embodiments of the present invention.

DETAILED DESCRIPTION

Figure 1B:
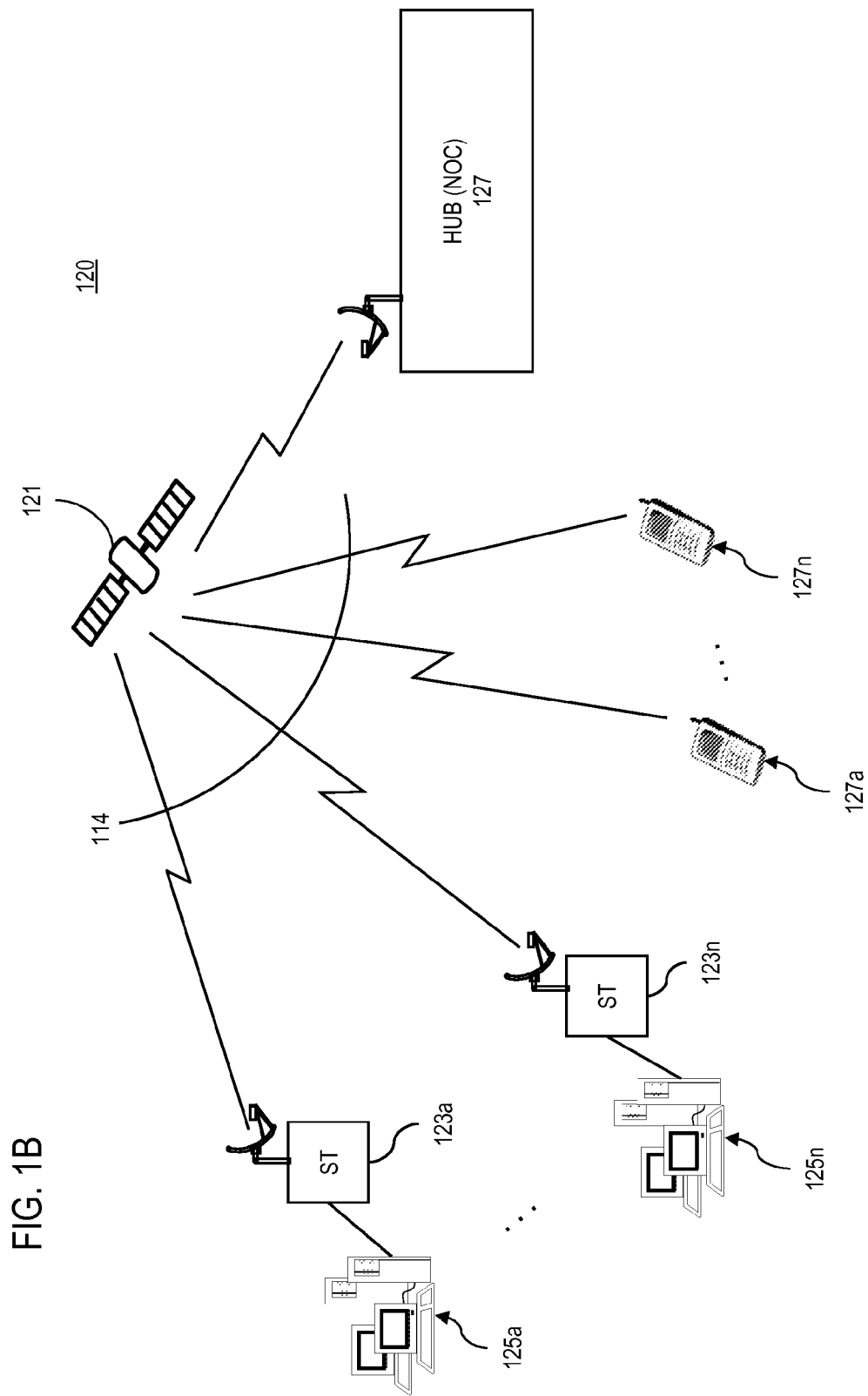
FIG. 1B illustrates a satellite communications system capable of employing modulation and coding protocols, in accordance with exemplary embodiments of the present invention.

A system and methods for communications system protocols to support communications services and applications over relatively low signal-to-noise ratio ($E_S/N_O$) links, is described. In the following description, for the purposes of explanation, numerous specific details are set forth in order to provide a thorough understanding of the invention. It is apparent, however, that the invention may be practiced without these specific details or with an equivalent arrangement. In other instances, well known structures and devices are shown in block diagram form in order to avoid unnecessarily obscuring the invention.

FIG. 1A illustrates a communications system capable of employing modulation and coding protocols, in accordance with exemplary embodiments of the present invention. With reference to FIG. 1A, a broadband communications system 110 includes one or more transmitters 112 (of which one is shown) that generate signal waveforms for transmission to one or more receivers 116 (of which one is shown). The signal waveforms are transmitted across a communications channel 114, which (for example) may comprise a channel of a terrestrial, wireless terrestrial or satellite communications system. In this discrete communications system 110, the transmitter 112 has a signal source that produces a discrete set of data signals, where each of the data signals is transmitted over a corresponding signal waveform. The discrete set of data signals may first be encoded (e.g., via a forward error correction (FEC) code) to combat noise and other issues associated with the channel 114. Once encoded, the encoded signals may then be modulated onto a carrier for transmission over the channel 114. The signal waveforms are attenuated, or otherwise altered, by communications channel 114.

FEC is required in terrestrial and satellite systems to provide high quality communication over a radio frequency (RF) propagation channel, which induces signal waveform and spectrum distortions, including signal attenuation (freespace propagation loss), multi-path induced fading and adjacent channel interference. These impairments drive the design of the radio transmission and receiver equipment; exemplary design objectives include selecting modulation formats, error control schemes, demodulation and decoding techniques and hardware components that together provide an efficient balance between system performance and implementation complexity. Differences in propagation channel characteristics, such as between terrestrial and satellite communication channels, naturally result in significantly different system designs. Likewise, existing communications systems continue to evolve in order to satisfy increased system requirements for new higher rate or higher fidelity communication services.

FIG. 1B illustrates a satellite communications system, in accordance with exemplary embodiments of the present invention. With reference to FIG. 1B, satellite communications system 120 includes a satellite 121 that supports communication among multiple satellite terminals (STs) 123a-123n, user terminals (UTs) 127a-127n, and a hub 127. The HUB 127 may assume the role of a Network Operations Center (NOC), which controls the access of the STs 123a-

123n and UTs 127a-127n to the system 120, and also provides element management functions and control of the address resolution and resource management functionality. The Satellite communications system 120 may operate as a traditional bent-pipe system, where the satellite essentially operates as a repeater. Alternatively, the system 120 may employ a switching or processing satellite supporting mesh communications (point-to-point communications directly between a pair of the STs 123a-123n and UTs 127a-127n).

In a traditional bent-pipe system of an exemplary embodiment, for example, the satellite operates as a repeater or bent pipe, and communications between the STs 123a-123n and UTs 127a-127n are transmitted over a double-hop path. For example, in a communication from ST 123a to ST 123n, over the first hop, the communication is transmitted, via the satellite, from the ST 123a to the HUB 127. The HUB 127 decodes the communication and determines the destination as ST 123n. The HUB 127 then appropriately addresses and repackages the communication, encodes and modulates it, and transmits the communication over the second hop, via the satellite, to the destination ST 123n. Accordingly, the satellite of such a system acts as a bent pipe or repeater, transmitting communications between the HUB 127 and the STs/UTs.

In an alternate embodiment, with a communications system 120 that employs a processing satellite (e.g., including a packet switch operating, for example, at a data link layer), the system may support direct unicast (point-to-point) communications and multicast communications among the STs 123a-123n and UTs 127a-127n. In the case of a processing satellite, the satellite 121 decodes the received signal and determines the destination ST(s)/UT(s) (as the hub 127 would in a bent-pipe system). The satellite 121 then addresses the data accordingly, encodes and modulates it, and transmits the modulated signal, over the channel 114, to the destination ST(s)/UT(s). Further, the STs 123a-123n may each provide connectivity to one or more respective hosts (e.g., hosts 125a-125n, respectively).

Further, based on recent trends in the advancement of current applications and services and in the development of new applications and services, it is envisioned that systems employing a multiplexing of data signals on the same channel 114 (e.g., time multiplexed), where (on a frame-by-frame basis) such data signals may be destined for different receive terminals of different capabilities (e.g., any combination of STs 125a-125n and UTs 127a-127n. For example, data signals destined for high S/N terminals (e.g., any of the STs 125a-125n) may be multiplexed with data signals destined for lower S/N terminals (e.g., any of the UTs 127a-127n), on the same channel 114 (on a frame-by-frame basis).

FIG. 2A illustrates a block diagram of an exemplary transmitter configured to operate in the systems of FIGS. 1A and 1B, in accordance with exemplary embodiments of the present invention. With reference to FIG. 2A, the transmitter 210 is equipped with a data encapsulation module 211 that accepts the original application layer source data and performs the upper layer encapsulation to from the baseband frames. The encoder (e.g., an FEC encoder) 213 receives the baseband frames from the data encapsulation module 211, and outputs a coded stream of higher redundancy suitable for error correction processing at the receiver (shown in FIG. 6). The encoded signal is fed to the modulator 215, which maps the encoded messages to signal waveforms, based in part on modulation signal constellations. For example, the data encapsulation module 211 performs the upper layer encapsulation to generate the baseband frames based on the source data bits, and then the encoder 213 and modulator 215 collectively perform the modulation and coding of the baseband frames and the generation of the physical layer frames, in accordance with the exemplary embodiments of the present invention. The physical layer frames are then transmitted (as signal waveforms), via the transmit antenna 217, over the communication channel 114 to the satellite 121.

Figure 2B:
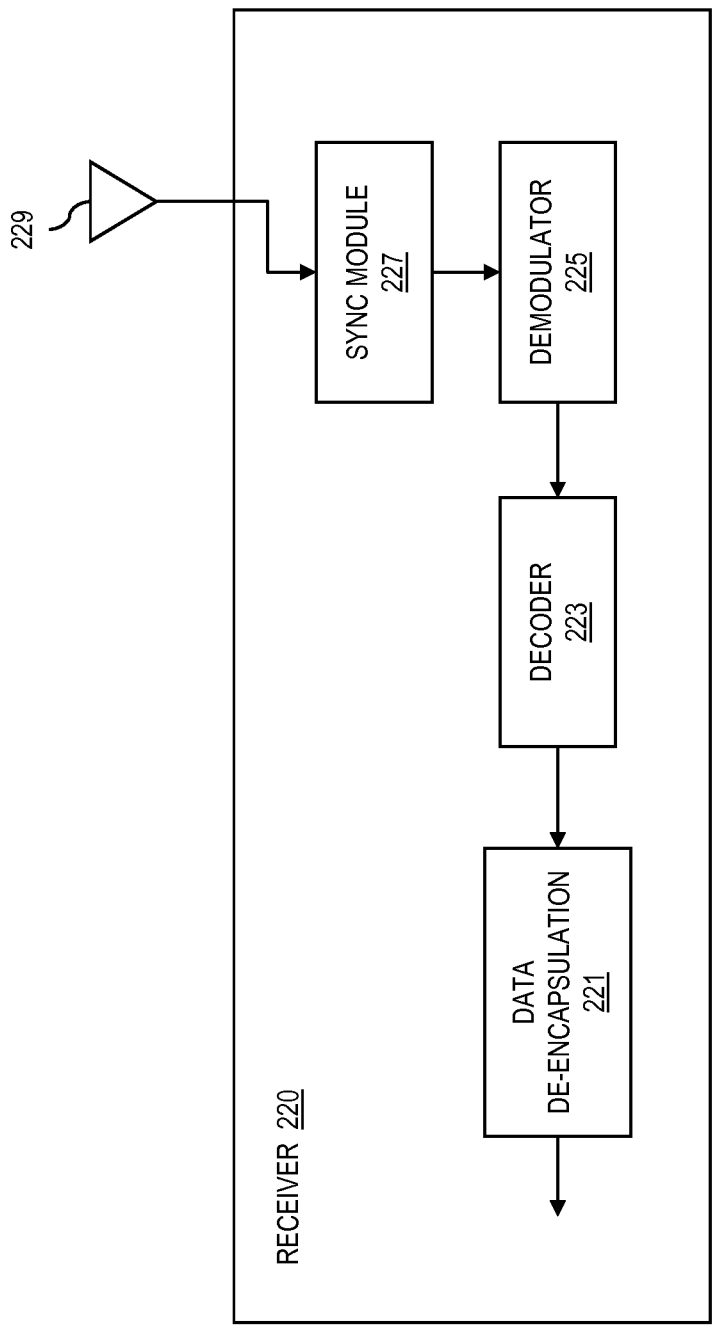
FIG. 2B illustrates a block diagram of an exemplary receiver configured to operate in the systems of FIGS. 1A and 1B, in accordance with exemplary embodiments of the present invention.

FIG. 2B illustrates a block diagram of an exemplary receiver configured to operate in the systems of FIGS. 1A and 1B, in accordance with exemplary embodiments of the present invention. With reference to FIG. 2B, the receiver 220 comprises receive antenna 229, sync module 227 demodulator 225, decoder 223 and de-encapsulation module 221. The receive antenna 229 receives the signal waveform transmitted over the channel 114 from the satellite 121. The sync module 227 detects the unique word, performs synchronization and determines the modcod and other PLS signaling of the PL Header. The demodulator 225 demodulates the received signal waveforms, based in part on the signal constellation employed for the modulation, to obtain the encoded signals. The decoder 223 then decodes the demodulated bit sequence to generate the encapsulated message data, and the de-encapsulation module 221 de-encapsulates the message data to regenerate the original source data.

As mentioned above, as one exemplary embodiment for broadcast and broadband communications services over satellite networks, the DVB-S2 standard has been adopted globally as a predominant standard for broadcast, interactive and other broadband services and applications. The framing structure, channel coding and modulation systems of the DVB-S2 standard are described in the European Telecommunications Standards Institute (ETSI) publication, ETSI EN 302 307 V1.3.1, which is incorporated herein by reference in its entirety. DVB-S2 represents a flexible standard, covering a variety of data and multimedia services delivered over satellite communications systems. Generic Stream Encapsulation (GSE) protocols may be employed to provide a data link layer protocol that facilitates the transmission of user or application data from packet oriented protocols (e.g., Internet protocol or IP) on top of a unidirectional physical layer protocol (e.g., DVB-S2). According to the GSE protocol, application data in the form of packet data units (PDUs) are first encapsulated within the baseband frames of the communications network (e.g., DVB-S2 baseband packets in a satellite communications system).

The DVB-S2 standard, for example, was designed to facilitate robust synchronization and signaling at the physical layer, and synchronization and detection of the modulation and coding parameters by a receiver before demodulation and FEC decoding. At the physical layer, baseband frames are encoded to form an output stream of FEC Frames. For example, the baseband frames are encoded by the FEC encoder 213, which comprises a t-error BCH outer coding via the BCH encoder 213a, an LDPC inner coding via the LDPC encoder 213b, and bit interleaving via the bit interleaver 213c. The interleaver 213c reorders the encoded sequence of symbols or bits from the LDPC encoder 213b in a predetermined manner. More specifically, the FEC coding subsystem of DVB-S2 comprises a BCH outer coding, LDPC inner coding and bit interleaving. The input to the FEC subsystem consists of a data stream of baseband frames, where each baseband frame of $K_{bch}$ bits is processed by the coding system to produce an FEC Frame of $n_{ldpc}$ bits, where $n_{ldpc}$=64,800 for a normal FEC Frame and $n_{ldpc}$=16,200 for a short FEC Frame.

Physical Layer framing is then performed, by slicing the XFEC Frames into a number of fixed length slots (of length M=90 symbols each), to generate the physical layer frames, as specified in Section 5.5 of the above-incorporated DVB-S2 publication, ETSI EN 302 307.

For the outer BCH coding, the BCH coding parameters are specified in the following tables:

TABLE 1a

Coding Parameters (normal FEC Frame – LDPC Coded Block $n_{ldpc} = 64800$)

| LDPC Code Rate | BCH Uncoded Block $K_{bch}$ | BCH Coded Block $N_{bch}$ LDPC Uncoded Block $k_{ldpc}$ | BCH t-Error Correction (bits) |
|---|---|---|---|
| 1/4 | 16008 | 16200 | 12 |
| 1/3 | 21408 | 21600 | 12 |
| 2/5 | 25728 | 25920 | 12 |
| 1/2 | 32208 | 32400 | 12 |
| 3/5 | 36688 | 38880 | 12 |
| 2/3 | 43040 | 43200 | 10 |
| 3/4 | 48408 | 48600 | 12 |
| 4/5 | 51648 | 51840 | 12 |
| 5/6 | 53840 | 54000 | 10 |
| 8/9 | 57472 | 57600 | 8 |
| 9/10 | 58192 | 58320 | 8 |

TABLE 1b

Coding Parameters (short FEC Frame – LDPC Coded Block $n_{ldpc} = 16200$)

| LDPC Code Rate | BCH Uncoded Block $K_{bch}$ | BCH Coded Block $N_{bch}$ LDPC Uncoded Block $k_{ldpc}$ | BCH t-Error Correction (bits) | Effective LDPC Rate ($k_{ldpc}/16200$) |
|---|---|---|---|---|
| 1/4 | 3072 | 3240 | 12 | 1/5 |
| 1/3 | 5232 | 5400 | 12 | 1/3 |
| 2/5 | 6312 | 6480 | 12 | 2/5 |
| 1/2 | 7032 | 7200 | 12 | 4/9 |
| 3/5 | 9552 | 9720 | 12 | 3/5 |
| 2/3 | 10632 | 10800 | 12 | 2/3 |
| 3/4 | 11712 | 11880 | 12 | 11/15 |
| 4/5 | 12432 | 12600 | 12 | 7/9 |
| 5/6 | 13152 | 13320 | 12 | 37/45 |
| 8/9 | 14232 | 14400 | 12 | 8/9 |
| 9/10 | N/A | N/A | N/A | N/A |

The generator polynomial of the BCH encoder is obtained by multiplying the first t polynomials specified in the following tables:

TABLE 2a

BCH Polynomials (normal FEC Frame – LDPC Coded Block $n_{ldpc} = 64800$)

| | |
|---|---|
| $g_1(x)$ | $1 + x^2 + x^3 + x^5 + x^{16}$ |
| $g_2(x)$ | $1 + x + x^4 + x^5 + x^6 + x^8 + x^{16}$ |
| $g_3(x)$ | $1 + x^2 + x^3 + x^4 + x^5 + x^7 + x^8 + x^9 + x^{10} + x^{11} + x^{16}$ |
| $g_4(x)$ | $1 + x^2 + x^4 + x^6 + x^9 + x^{11} + x^{12} + x^{14} + x^{16}$ |
| $g_5(x)$ | $1 + x + x^2 + x^3 + x^5 + x^8 + x^9 + x^{10} + x^{11} + x^{12} + x^{16}$ |
| $g_6(x)$ | $1 + x^2 + x^4 + x^5 + x^7 + x^8 + x^9 + x^{10} + x^{12} + x^{13} + x^{14} + x^{15} + x^{16}$ |
| $g_7(x)$ | $1 + x^2 + x^5 + x^6 + x^8 + x^9 + x^{10} + x^{11} + x^{13} + x^{15} + x^{16}$ |
| $g_8(x)$ | $1 + x^2 + x^5 + x^6 + x^8 + x^9 + x^{12} + x^{13} + x^{14} + x^{16}$ |
| $g_9(x)$ | $1 + x^5 + x^7 + x^9 + x^{10} + x^{11} + x^{16}$ |
| $g_{10}(x)$ | $1 + x + x^2 + x^5 + x^7 + x^8 + x^{10} + x^{12} + x^{13} + x^{14} + x^{16}$ |
| $g_{11}(x)$ | $1 + x^2 + x^3 + x^5 + x^9 + x^{11} + x^{12} + x^{13} + x^{16}$ |
| $g_{12}(x)$ | $1 + x + x^5 + x^6 + x^7 + x^9 + x^{11} + x^{12} + x^{16}$ |

TABLE 2b

BCH Polynomials (short FEC Frame – LDPC Coded Block $n_{ldpc} = 16200$)

| | |
|---|---|
| $g_1(x)$ | $1 + x + x^3 + x^5 + x^{14}$ |
| $g_2(x)$ | $1 + x^6 + x^8 + x^{11} + x^{14}$ |
| $g_3(x)$ | $1 + x + x^2 + x^6 + x^9 + x^{10} + x^{14}$ |
| $g_4(x)$ | $1 + x^4 + x^7 + x^8 + x^{10} + x^{12} + x^{14}$ |
| $g_5(x)$ | $1 + x^2 + x^4 + x^6 + x^8 + x^9 + x^{11} + x^{13} + x^{14}$ |
| $g_6(x)$ | $1 + x^3 + x^7 + x^8 + x^9 + x^{13} + x^{14}$ |
| $g_7(x)$ | $1 + x^2 + x^5 + x^6 + x^7 + x^{10} + x^{11} + x^{13} + x^{14}$ |
| $g_8(x)$ | $1 + x^5 + x^8 + x^9 + x^{10} + x^{11} + x^{14}$ |
| $g_9(x)$ | $1 + x + x^2 + x^3 + x^9 + x^{10} + x^{14}$ |
| $g_{10}(x)$ | $1 + x^3 + x^6 + x^9 + x^{11} + x^{12} + x^{14}$ |
| $g_{11}(x)$ | $1 + x^4 + x^{11} + x^{12} + x^{14}$ |
| $g_{12}(x)$ | $1 + x + x^2 + x^3 + x^5 + x^6 + x^7 + x^8 + x^{10} + x^{13} + x^{14}$ |

The BCH encoding of information bits $m=(m_{k_{bch}-1}, m_{k_{bch}-2}, \ldots m_1, m_0)$ onto a codeword $c=(m_{k_{bch}-1}, m_{k_{bch}-2}, \ldots m_1, m_0, d_{n_{bch}-k_{bch}-1}, d_{n_{bch}-k_{bch}-2}, \ldots d_1, d_0)$ is achieved as follows: (1) multiply the message polynomial $m(x) = (m_{k_{bch}-1}x^{k_{bch}-1} + m_{k_{bch}-2}x^{k_{bch}-2} + \ldots + m_1x + m_0)$ by $x^{n_{bch}-k_{bch}}$; (2) divide $x^{n_{bch}-k_{bch}}m(x)$ by the generator polynomial $g(x)$, where $d(x)=(d_{n_{bch}-1}x^{n_{bch}-k_{bch}-1} + \ldots + d_1x + d_0)$ is the remainder; and (3) set the codeword polynomial $c(x)=x^{n_{bch}-k_{bch}}m(x) + d(x)$.

Next, for the LDPC inner coding, the LDPC encoder systematically encodes an information block of size $k_{ldpc}$, $i=(i_0, i_1, \ldots, i_{k_{ldpc}-1})$ onto a codeword of size $n_{ldpc}$, $c=(i_0, i_1, \ldots, i_{k_{ldpc}-1}, p_0, p_1, \ldots, p_{n_{ldpc}-k_{ldpc}-1})$. The transmission of the codeword starts in the given order from $i_0$ and ends with $p_{n_{ldpc}-k_{ldpc}-1}$. The LDPC code parameters ($k_{ldpc}$, $n_{ldpc}$) are specified in the above tables 1a and 1b. For backwards compatible modes, the output of the inner code is processed according to Annex F of the above-incorporated DVB-S2 publication, ETSI EN 302 307.

The task of the LDPC encoder is to determine $n_{ldpc}-k_{ldpc}$ parity bits ($p_0, p_1, \ldots, p_{n_{ldpc}-k_{ldpc}-1}$) for every block of $k_{ldpc}$ information bits ($i_0, i_1, \ldots, i_{k_{ldpc}-1}$). The procedure is as follows: (1) initialize $p_0=p_1=\ldots=p_{n_{ldpc}-k_{ldpc}-1}=0$; (2) for the first information bit $i_0$, accumulate $i_0$ at the parity bit addresses specified in the first row of the table for the respective code rate and FEC Frame size—The tables are specified in Annexes B and C of the above-incorporated DVB-S2 publication, ETSI EN 302 307. For example, for the rate 2/3 code for $n_{ldpc}=64800$ (Table B.6 of Annex B), where all additions are in GF(2):

$p_0 = p_0 \oplus i_0 \; p_{2767} = p_{2767} \oplus i_0$
$p_{10491} = p_{10491} \oplus i_0 \; p_{240} = p_{240} \oplus i_0$
$p_{16043} = p_{16043} \oplus i_0 \; p_{18673} = p_{18673} \oplus i_0$
$p_{506} = p_{506} \oplus i_0 \; p_{9279} = p_{9279} \oplus i_0$
$p_{12826} = p_{12826} \oplus i_0 \; p_{10579} = p_{10579} \oplus i_0$
$p_{8065} = p_{8065} \oplus i_0 \; p_{20928} = p_{20928} \oplus i_0$
$p_{8226} = p_{8226} \oplus i_0$ (3) for the next 359 information bits $i_m$, $m=1, 2, \ldots, 359$, accumulate $i_m$ at parity bit addresses $\{x+m \bmod 360*q\} \bmod (n_{ldpc}-k_{ldpc})$, where x denotes the address of the parity bit accumulator corresponding to the first bit $i_0$, and q is a code rate dependent constant (specified in Tables 3a and 3b, below). Continuing with the example for the rate 2/3 code for $n_{ldpc}=64800$, q=60–so, for example, for information bit $i_1$, the following operations are performed:

$p_{60} = p_{60} \oplus i_1 \; p_{2827} = p_{2827} \oplus i_1$
$p_{10551} = p_{10551} \oplus i_1 \; p_{300} = p_{300} \oplus i_1$
$p_{16103} = p_{16103} \oplus i_1 \; p_{18733} = p_{18733} \oplus i_1$
$p_{566} = p_{566} \oplus i_1 \; p_{9339} = p_{9339} \oplus i_1$
$p_{12886} = p_{12886} \oplus i_1 \; p_{10639} = p_{10639} \oplus i_1$
$p_{8125} = p_{8125} \oplus i_1 \; p_{20988} = p_{20988} \oplus i_1$
$p_{8286} = p_{8286} \oplus i_1$ (4) for the 361$^{st}$ information bit $i_{360}$, accumulate $i_{360}$ at the parity bit addresses specified in the second row of the appropriate table (in Annexes B and C of ETSI EN 302 307) table for the respective code rate and FEC Frame size. Then, in a similar manner the addresses of the parity bit accumulators for the following 359 information bits $i_m$, m=361, 362, . . . , 719 are obtained using the formula {x+m mod 360*q} mod ($n_{ldpc}-k_{ldpc}$), where x denotes the address of the parity bit accumulator corresponding to the first bit $i_{360}$, (the entries of the second row of the respective table); and (5) in a similar manner, for every group of 360 new information bits, a new row from the respective table is used to find the addresses of the parity bit accumulators.

Then, once all the information bits are exhausted, the final parity bits are obtained by sequentially performing the following operations, starting with i=1, $p_i=p_i\oplus p_{i-1}$, where i=1, 2, . . . $n_{ldpc}-k_{ldpc}-1$, and then the final content of $p_i$, i=0, 1, . . . , $n_{ldpc}-k_{ldpc}-1$ is equal to the parity bit $p_i$.

TABLE 3a q Values (normal FEC Frame – LDPC Coded Block $n_{ldpc}$ = 64800)

| LDPC Code Rate | q |
|---|---|
| 1/4 | 135 |
| 1/3 | 120 |
| 2/5 | 108 |
| 1/2 | 90 |
| 3/5 | 72 |
| 2/3 | 60 |
| 3/4 | 45 |
| 4/5 | 36 |
| 5/6 | 30 |
| 8/9 | 20 |
| 9/10 | 18 |

TABLE 3b q Values (short FEC Frame – LDPC Coded Block $n_{ldpc}$ = 16200)

| LDPC Code Rate | q |
|---|---|
| 1/4 | 36 |
| 1/3 | 30 |
| 2/5 | 27 |
| 1/2 | 25 |
| 3/5 | 18 |
| 2/3 | 15 |
| 3/4 | 12 |
| 4/5 | 10 |
| 5/6 | 8 |
| 8/9 | 5 |

Figure 3A:
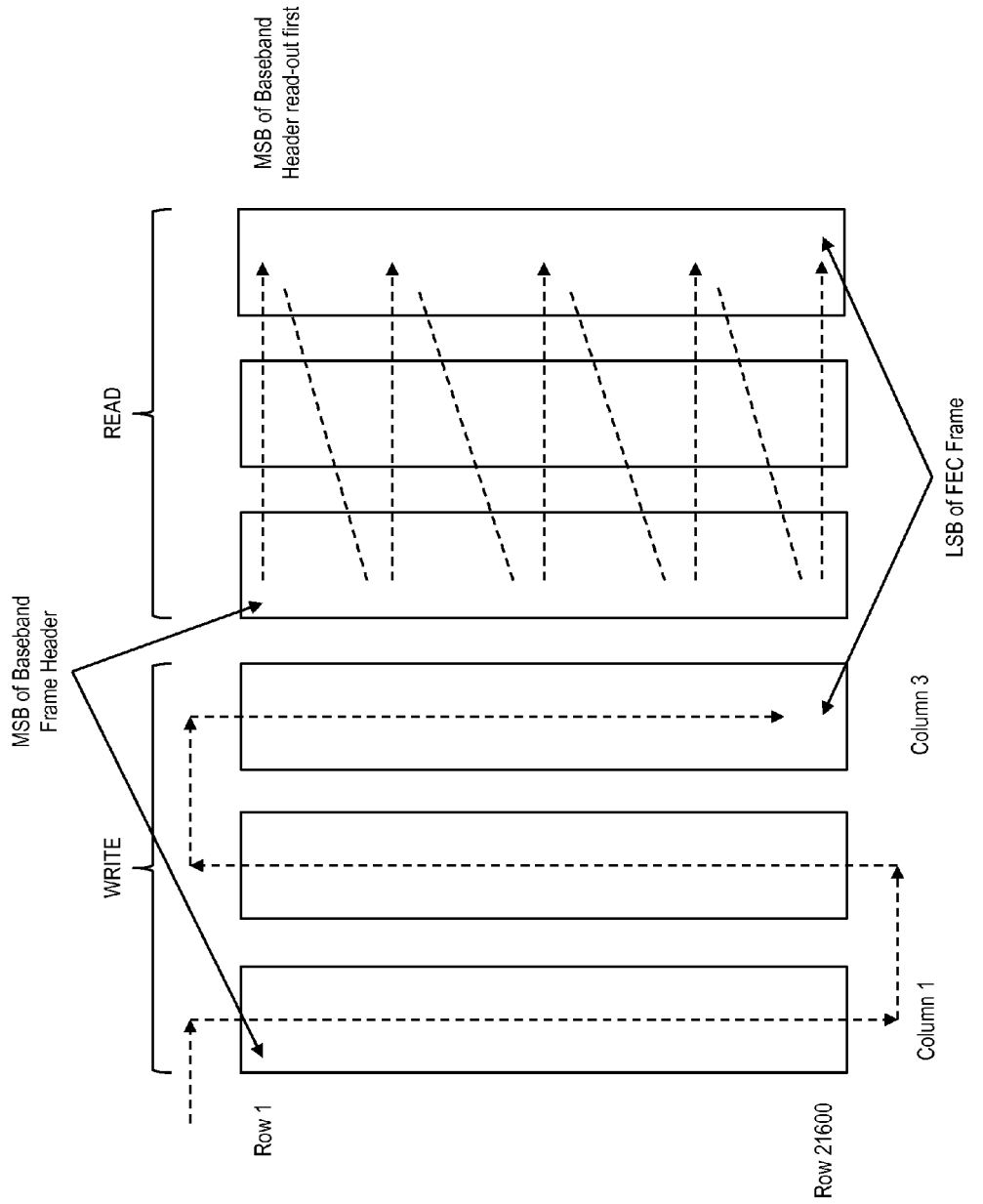
FIG. 3A illustrates the bit interleaving scheme for the 8PSK modulation formats (for all rates except rate 3/5) of the DVB-S2 standard for the normal FEC Frame length.
Figure 3B:
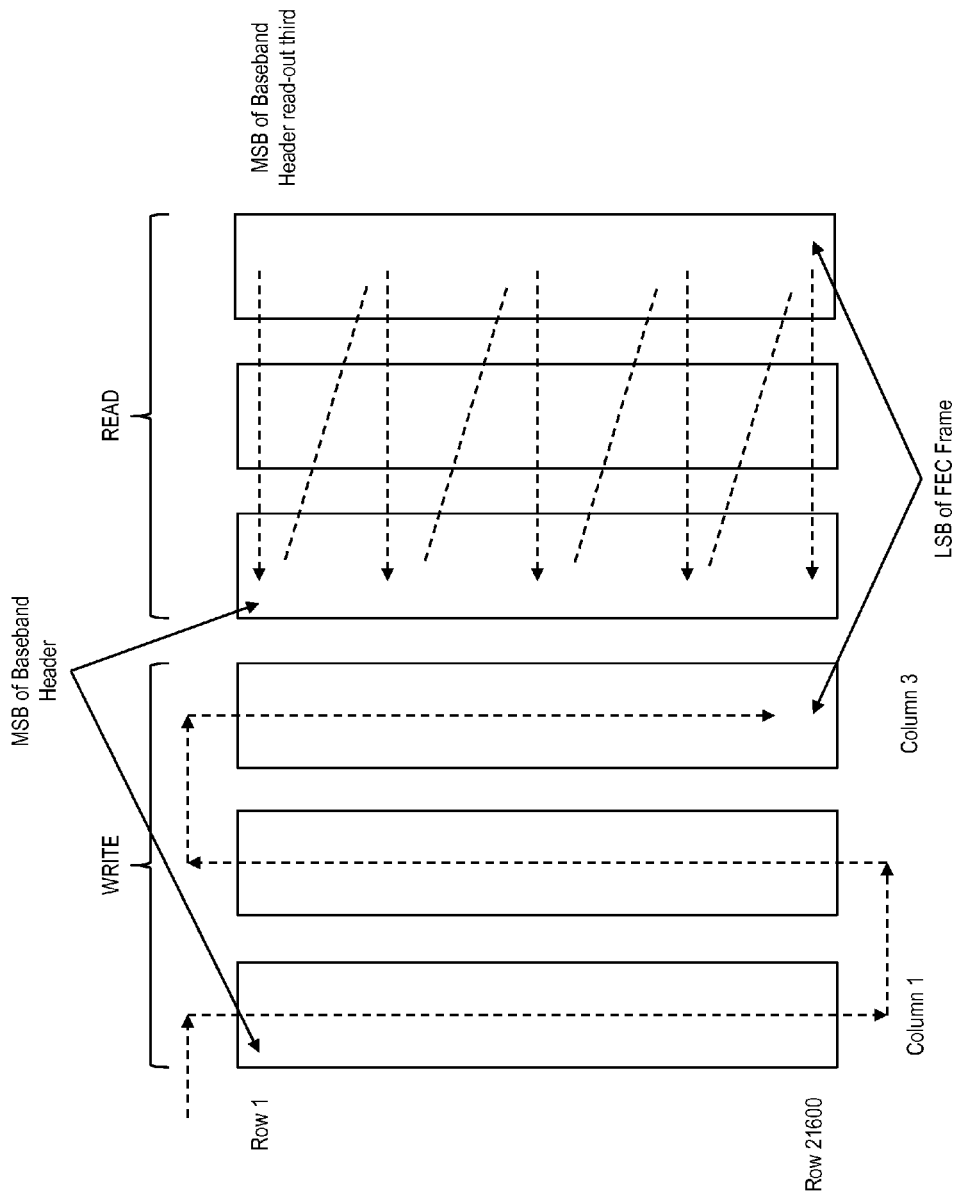
FIG. 3B illustrates the bit interleaving scheme for the 8PSK modulation formats (for rate 3/5 only) of the DVB-S2 standard for the normal FEC Frame length.

With reference to FIGS. 3A and 3B, for the 8PSK, 16APSK and 32APSK modulation schemes of the DVB-S2 standard, the bit interleaver 213c comprises a block interleaver that interleaves the output of the LDPC encoder 213b. Data is serially written into the interleaver column-wise, and serially read out row-wise (the MSB of baseband frame header is read out first, except in the case of the 8PSK rate 3/5 modulation where MSB of the baseband frame header is read out third), as illustrated in FIGS. 3A and 3B, respectively. The configuration of the block interleaver for each modulation format is specified in the following table:

TABLE 4

Block Interleaver Configurations

| Modulation | Rows ($n_{ldpc}$ = 64800) | Rows ($n_{ldpc}$ = 16200) | Columns |
|---|---|---|---|
| 8PSK | 21600 | 5400 | 3 |
| 16APSK | 16200 | 4050 | 4 |
| 32APSK | 12960 | 3240 | 5 |

For the DVB-S2 modulation, each FEC Frame (comprising a sequence of 64,800 bits for a normal FEC Frame, or 16,200 bits for a short FEC Frame) is then modulated based on one of various options specified in the standard for modulation of the data payload (e.g., QPSK, 8PSK, 16APSK, or 32APSK). For example, each FEC Frame is serial-to-parallel converted with the following parallelism levels: $\eta_{MOD}$2 for QPSK; $\eta_{MOD}$3 for 8PSK; $\eta_{MOD}$ 4 for 16APSK; $\eta_{MOD}$ 5 for 32APSK. Then, each resulting parallel sequence is mapped based on a signal constellation, generating an (I, Q) sequence of variable length depending on the selected modulation efficiency ($\eta_{MOD}$ bits/Hz). The DVB-S2 signal constellations for the QPSK, 8PSK, 16APSK, and 32APSK modulation schemes are illustrated in FIGS. 9-12 (respectively) of the above-incorporated DVB-S2 publication, ETSI EN 302 307. The resulting output sequence is referred to as a complex FEC Frame or XFEC Frame, composed of 64,800/$\eta_{MOD}$(normal XFEC Frame) modulation symbols, or 16,200/$\eta_{MOD}$(short XFEC Frame) modulation symbols. Each modulation symbol thereby comprises a complex vector in the format (I, Q) (I being the in-phase component and Q the quadrature component), or in the equivalent format $\rho$exp j$\emptyset$ ($\rho$ being the modulus of the vector and $\emptyset$ being its phase).

Figure 4:
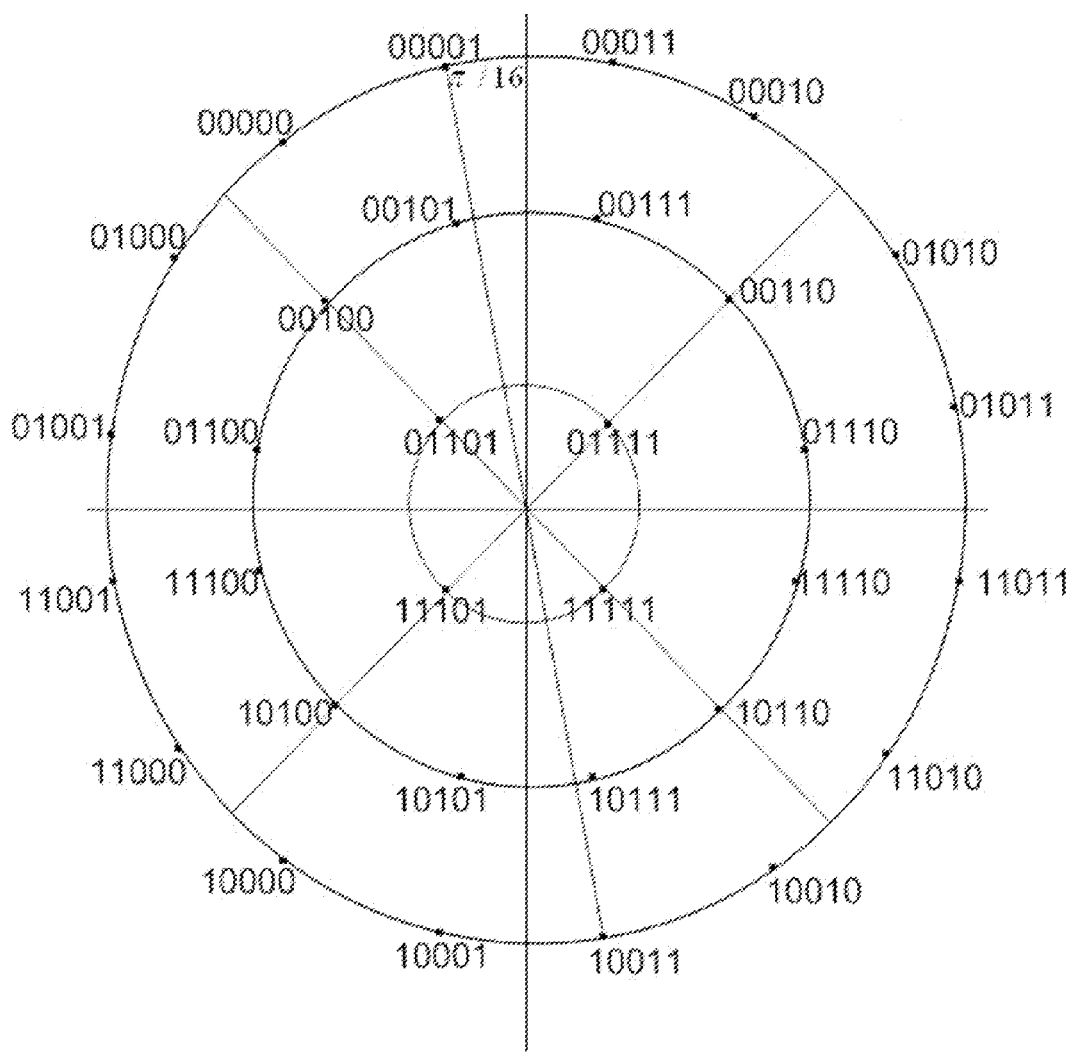
FIG. 4 illustrates a prior art 32APSK (4+12+16) signal constellation.

With respect to other current modulation schemes, U.S. patent application Ser. Nos. 13/327,316 and 13/890,643 provide a 32APSK constellation. The 32APSK signal constellation is provided with a ring format of 4+12+16 (4 constellation points on the inner-most ring, 12 constellation points on the next outer ring, and 16 constellation points on the outer-most ring). The bit labeling and [x, y] signal point coordinates (where the outer ring is rotated by $\pi$/16 as compared to the DVB-S2 32APSK constellation) of this 32APSK constellation are as follows (where $\epsilon_x$ represents average energy per symbol, 4*R1$^2$+12*R2$^2$+16*R3$^2$=32, and R1 represents the radius of the inner-most ring, R2 represents the radius of the middle ring and R3 represents the radius of the outer ring), as further illustrated in FIG. 4:

| Bit Label | [x, y] Coordinates |
|---|---|
| 00000 | [−R3 * $\sqrt{\epsilon_x}$ * cos(5.0 * $\pi$/16.0), R3 * $\sqrt{\epsilon_x}$ * cos(3.0 * $\pi$/16.0)] |
| 00001 | [−R3 * $\sqrt{\epsilon_x}$ * cos(7.0 * $\pi$/16.0), R3 * $\sqrt{\epsilon_x}$ * cos($\pi$/16.0)] |
| 00010 | [R3 * $\sqrt{\epsilon_x}$ * cos(5.0 * $\pi$/16.0), R3 * $\sqrt{\epsilon_x}$ * cos(3.0 * $\pi$/16.0)] |
| 00011 | [R3 * $\sqrt{\epsilon_x}$ * cos(7.0 * $\pi$/16.0), R3 * $\sqrt{\epsilon_x}$ * cos($\pi$/16.0)] |
| 00100 | [−R2 * $\sqrt{\epsilon_x}$ * sin($\pi$/4.0), R2 * $\sqrt{\epsilon_x}$ * sin($\pi$/4.0)] |
| 00101 | [−R2 * $\sqrt{\epsilon_x}$ * sin($\pi$/12.0), R2 * $\sqrt{\epsilon_x}$ * sin(5.0 * $\pi$/12.0)] |
| 00110 | [R2 * $\sqrt{\epsilon_x}$ * sin($\pi$/4.0), R2 * $\sqrt{\epsilon_x}$ * sin($\pi$/4.0)] |
| 00111 | [R2 * $\sqrt{\epsilon_x}$ * sin($\pi$/12.0), R2 * $\sqrt{\epsilon_x}$ * sin(5.0 * $\pi$/12.0)] |
| 01000 | [−R3 * $\sqrt{\epsilon_x}$ * cos(3.0 * $\pi$/16.0), R3 * $\sqrt{\epsilon_x}$ * cos(5.0 * $\pi$/16.0)] |
| 01001 | [−R3 * $\sqrt{\epsilon_x}$ * cos($\pi$/16.0), R3 * $\sqrt{\epsilon_x}$ * cos(7.0 * $\pi$/16.0)] |
| 01010 | [R3 * $\sqrt{\epsilon_x}$ * cos(3.0 * $\pi$/16.0), R3 * $\sqrt{\epsilon_x}$ * cos(5.0 * $\pi$/16.0)] |
| 01011 | [R3 * $\sqrt{\epsilon_x}$ * cos($\pi$/16.0), R3 * $\sqrt{\epsilon_x}$ * cos(7.0 * $\pi$/16.0)] |
| 01100 | [−R2 * $\sqrt{\epsilon_x}$ * sin(5.0 * $\pi$/12.0), R2 * $\sqrt{\epsilon_x}$ * sin($\pi$/12.0)] |
| 01101 | [−R1 * $\sqrt{\epsilon_x}$ * sin($\pi$/4.0), R1 * $\sqrt{\epsilon_x}$ * sin($\pi$/4.0)] |
| 01110 | [R2 * $\sqrt{\epsilon_x}$ * sin(5.0 * $\pi$/12.0), R2 * $\sqrt{\epsilon_x}$ * sin($\pi$/12.0)] |
| 01111 | [R1 * $\sqrt{\epsilon_x}$ * sin($\pi$/4.0), R1 * $\sqrt{\epsilon_x}$ * sin($\pi$/4.0)] |

-continued

| Bit Label | [x, y] Coordinates |
|---|---|
| 10000 | [−R3 * $\sqrt{\epsilon_x}$ * cos(5.0 * π/16.0), −R3 * $\sqrt{\epsilon_x}$ * cos(3.0 * π/16.0)] |
| 10001 | [−R3 * $\sqrt{\epsilon_x}$ * cos(7.0 * π/16.0), −R3 * $\sqrt{\epsilon_x}$ * cos(π/16.0)] |
| 10010 | [R3 * $\sqrt{\epsilon_x}$ * cos(5.0 * π/16.0), −R3 * $\sqrt{\epsilon_x}$ * cos(3.0 * π/16.0)] |
| 10011 | [R3 * $\sqrt{\epsilon_x}$ * cos(7.0 * π/16.0), −R3 * $\sqrt{\epsilon_x}$ * cos(π/16.0)] |
| 10100 | [−R2 * $\sqrt{\epsilon_x}$ * sin(π/4.0), −R2 * $\sqrt{\epsilon_x}$ * sin(π/4.0)] |
| 10101 | [−R2 * $\sqrt{\epsilon_x}$ * sin(π/12.0), −R2 * $\sqrt{\epsilon_x}$ * sin(5.0 * π/12.0)] |
| 10110 | [R2 * $\sqrt{\epsilon_x}$ * sin(π/4.0), −R2 * $\sqrt{\epsilon_x}$ * sin(π/4.0)] |
| 10111 | [R2 * $\sqrt{\epsilon_x}$ * sin(π/12.0), −R2 * $\sqrt{\epsilon_x}$ * sin(5.0 * π/12.0)] |
| 11000 | [−R3 * $\sqrt{\epsilon_x}$ * cos(3.0 * π/16.0), −R3 * $\sqrt{\epsilon_x}$ * cos(5.0 * π/16.0)] |
| 11001 | [−R3 * $\sqrt{\epsilon_x}$ * cos(π/16.0), −R3 * $\sqrt{\epsilon_x}$ * cos(7.0 * π/16.0)] |
| 11010 | [R3 * $\sqrt{\epsilon_x}$ * cos(3.0 * π/16.0), −R3 * $\sqrt{\epsilon_x}$ * cos(5.0 * π/16.0)] |
| 11011 | [R3 * $\sqrt{\epsilon_x}$ * cos(π/16.0), −R3 * $\sqrt{\epsilon_x}$ * cos(7.0 * π/16.0)] |
| 11100 | [−R2 * $\sqrt{\epsilon_x}$ * sin(5.0 * π/12.0), −R2 * $\sqrt{\epsilon_x}$ * sin(π/12.0)] |
| 11101 | [−R1 * $\sqrt{\epsilon_x}$ * sin(π/4.0), −R1 * $\sqrt{\epsilon_x}$ * sin(π/4.0)] |
| 11110 | [R2 * $\sqrt{\epsilon_x}$ * sin(5.0 * π/12.0), −R2 * $\sqrt{\epsilon_x}$ * sin(π/12.0)] |
| 11111 | [R1 * $\sqrt{\epsilon_x}$ * sin(π/4.0), −R1 * $\sqrt{\epsilon_x}$ * sin(π/4.0)] |

This 32APSK constellation achieves improved performance over other current 32APSK modulation constellations (e.g., approximately 0.2 dB better performance over the 32APSK constellation of the DVB-S2 standard). Despite the better performance of this constellation, however, to maintain compatibility with the DVB-S2 standard (and preserve the 32APSK modcods thereof), the 32APSK constellation may be applied with only those new codes (and respective code rates), provided pursuant to the exemplary embodiments of the present invention, disclosed herein. As is evident, though, this 32APSK constellation could be applied with other codes (and respective code rates), such as those provided in the DVB-S2 standard.

As specified above, however, current modulation and coding schemes (e.g., the modulation and coding schemes of the DVB-S2 standard) lack support for the operational requirements of terminals at relatively low $E_S/N_0$ ratios (e.g., below approximately −3 dB). Additionally, such current modulation and coding schemes also lack sufficient granularity for terminals within an intermediate $E_S/N_0$ operational range (e.g., from approximately −3 dB to 15.5 dB). Moreover, codes of shorter block sizes are also needed within such operational ranges.

In accordance with exemplary embodiments of the present invention, therefore, modulation and coding schemes are provided that support terminals with operational requirements at relatively low $E_S/N_0$ ratios (e.g., within the range of approximately −3 dB to −10 dB), and that provide finer granularity for terminals with operational requirements within an intermediate operational range (e.g., approximately −3 dB to 15.5 dB). Further, such new modulation and coding schemes are provided with intermediate block lengths. For example, exemplary embodiments provide the following new improved modulation and coding schemes:

TABLE 5

Modulation and Code Rates

| Modulation | Code Rate |
|---|---|
| π/2 BPSK | 1/5 |
| π/2 BPSK | 11/45 |
| π/2 BPSK | 1/3 |
| QPSK | 1/5 |
| QPSK | 11/45 |
| QPSK | 1/3 |

Additionally, with respect to the outer BCH coding of the FEC encoding, in accordance with exemplary embodiments, the coding is performed as described above based on the coding parameters (including the BCH t-error correction parameters) and the BCH polynomials as specified in the following tables 6a and 6b:

TABLE 6a

Coding Parameters (medium FERFRAME $n_{ldpc}$ = 32400)

| LDPC Code Identifier | BCH uncoded block $K_{BCH}$ | BCH coded block $N_{BCH}$ LDPC uncoded block $k_{ldpc}$ | BCH t-error correction | LDPC coded block $n_{ldpc}$ |
|---|---|---|---|---|
| 1/5 | 6300 | 6480 | 12 | 32400 |
| 11/45 | 7740 | 7920 | 12 | 32400 |
| 1/3 | 10620 | 10800 | 12 | 32400 |

TABLE 6b

BCH Polynomials (medium FECFRAME $n_{ldpc}$ = 32400)

| | |
|---|---|
| $g_1(x)$ | $1 + x^2 + x^3 + x^5 + x^{15}$ |
| $g_2(x)$ | $1 + x + x^4 + x^7 + x^{10} + x^{11} + x^{15}$ |
| $g_3(x)$ | $1 + x^2 + x^4 + x^6 + x^8 + x^{10} + x^{12} + x^{13} + x^{15}$ |
| $g_4(x)$ | $1 + x^2 + x^3 + x^5 + x^6 + x^8 + x^{10} + x^{11} + x^{15}$ |
| $g_5(x)$ | $1 + x + x^2 + x^4 + x^6 + x^7 + x^{10} + x^{12} + x^{15}$ |
| $g_6(x)$ | $1 + x^4 + x^6 + x^7 + x^{12} + x^{13} + x^{15}$ |
| $g_7(x)$ | $1 + x^2 + x^4 + x^5 + x^7 + x^{11} + x^{12} + x^{14} + x^{15}$ |
| $g_8(x)$ | $1 + x^2 + x^4 + x^6 + x^8 + x^9 + x^{11} + x^{14} + x^{15}$ |
| $g_9(x)$ | $1 + x + x^2 + x^4 + x^5 + x^7 + x^9 + x^{11} + x^{12} + x^{13} + x^{15}$ |
| $g_{10}(x)$ | $1 + x + x^2 + x^3 + x^4 + x^7 + x^{10} + x^{11} + x^{12} + x^{13} + x^{15}$ |
| $g_{11}(x)$ | $1 + x + x^2 + x^4 + x^9 + x^{11} + x^{15}$ |
| $g_{12}(x)$ | $1 + x^2 + x^4 + x^8 + x^{10} + x^{11} + x^{13} + x^{14} + x^{15}$ |

Further, with respect to bit interleaving, because such exemplary embodiments do not apply the provided intermediate codes with high-order modulation schemes, interleaving is not generally employed. The scope of potential embodiments of the present invention, however, would not preclude the application of an interleaver, or the application of the provided intermediate codes with high-order modulation scenarios.

With respect to the inner LDPC coding of the FEC encoding, in accordance with exemplary embodiments of the present invention, the respective parity bit accumulator address tables for the respective code rates and FEC Frame lengths are specified in the following parity bit accumulator tables (where, for each code rate R, the q values are as follows: q=(n−k)/360, (where n=32400 and k=R*n)):

TABLE 8 q Values

| Code Rate | q |
|---|---|
| 1/5 | 72 |
| 11/45 | 68 |
| 1/3 | 60 |

TABLE 9a

Address of Parity Bit Accumulators (Rate 1/5) ($n_{ldpc}$ = 32400)

18222 6715 4908 21568 22821 11708 4769 4495 22243 25872 9051 19072 13956
2038 5205 21215 21009 9584 2403 23652 20866 20130 677 9509 6136 773
19936 14590 17829 473 4432 23171 11386 17937 22084 24450 267 8822 19335
16376 16769 5111 9794 18907 827 12385 12370 21647 10938 23619 11633 15865
23417 7631 12243 21546 4192 22117 14757 4118 9686 17021 8531 15989 8807
15533 16584 18529 19699 17821 4252 1254 5952 3163 20295 6944 1022 19743
129 16579 23524 25897 14690 11222 16250 9925 4268 999 7102 24528 152
18361 3708 3454 16604 1551 5809 20324 4775 22418 19091 19674 10975 7327
24133 10950 22779 11388 13818 20668 7556 12333 16446 19684 12510 25118 8162
17026 6850 1269
21895 7137 25270
11858 24153 13303
7885 16438 12805
10473 15004 8052
2088 10379 10067
21438 13426 10440
17696 727 12164
22623 8408 17849

TABLE 9b

Address of Parity Bit Accumulators (Rate 11/45) ($n_{ldpc}$ = 32400)

20617 6867 14845 11974 22563 190 17207 4052 7406 16007
21448 14846 2543 23380 16633 20365 16869 13411 19853 795
5200 2330 2775 23620 20643 10745 14742 6493 14222 20939
9445 9523 12769 7332 21792 18717 16397 14016 9481 22162
2922 6427 4497 4116 17658 2581 14364 3781 18851 22974
10383 2184 1433 3889 12828 17424 17580 20936 1390 21374
425 2063 22398 20907 9445 14790 4457 723 7048 4072
11771 9640 23212 9613 12042 8335 21386 20129 13521 16301
14867 12501 1086 21526 17701 17731 20907 8790 19224 5784
7107 19690 17616 5800 9501 23320 16878 794 15931 17539
4556 21783 1524
20100 11706 23663
2535 15530 6116
12078 3867 2663
19629 20246 7024
11748 11426 19802
15942 12333 5316
11521 3170 17818
2289 23780 16575
6649 16991 13025
20050 10619 10250
3944 13063 5656

TABLE 9c

Address of Parity Bit Accumulators (Rate 1/3) ($n_{ldpc}$ = 32400)

7416 4093 16722 1023 20586 12219 9175 16284 1554 10113 19849 17545
13140 3257 2110 13888 3023 1537 1598 15018 18931 13905 10617 1014
339 14366 3309 15360 18358 3196 4412 6023 7070 17380 2777 6691
12720 17634 4141 1400 8247 18201 16077 11314 11928 3494 3155 2865
21038 6928 3860 1943 20292 6526 12939 15182 3957 5651 356 2673
20555 17905 5724 13932 1218 17763 5912 5164 6233 6220 1277 19209
19190 4498 4950 6645 5482 5667 13701 16334 15231 735 8589 12344
679 17849 17807 16033 10181 3368 5778 8275 2736 14042 17506 6005
1576 10259 10525 3007 16522 697 7726 8641 14323 2893 8168 11070
17270 10180 18740 847 4969 14715 19316 5530 17428 11193 9861 13562
6156 18787 10467
2422 3723 10769
8015 18716 13406
5969 15949 3084
6855 13990 3764
10351 15779 10392
16078 19034 11279
11747 6608 4188
19699 8928 8045
4598 7219 11391
19766 11871 5692
7487 15905 17621
8554 7751 16516

TABLE 9c-continued

Address of Parity Bit Accumulators (Rate 1/3) ($n_{ldpc}$ = 32400)

4981 20250 16146
12524 21364 10793
17083 2051 8862
1315 6246 7721
18043 16652 5502
1432 5674 2224
11257 1312 8453

Figure 5:
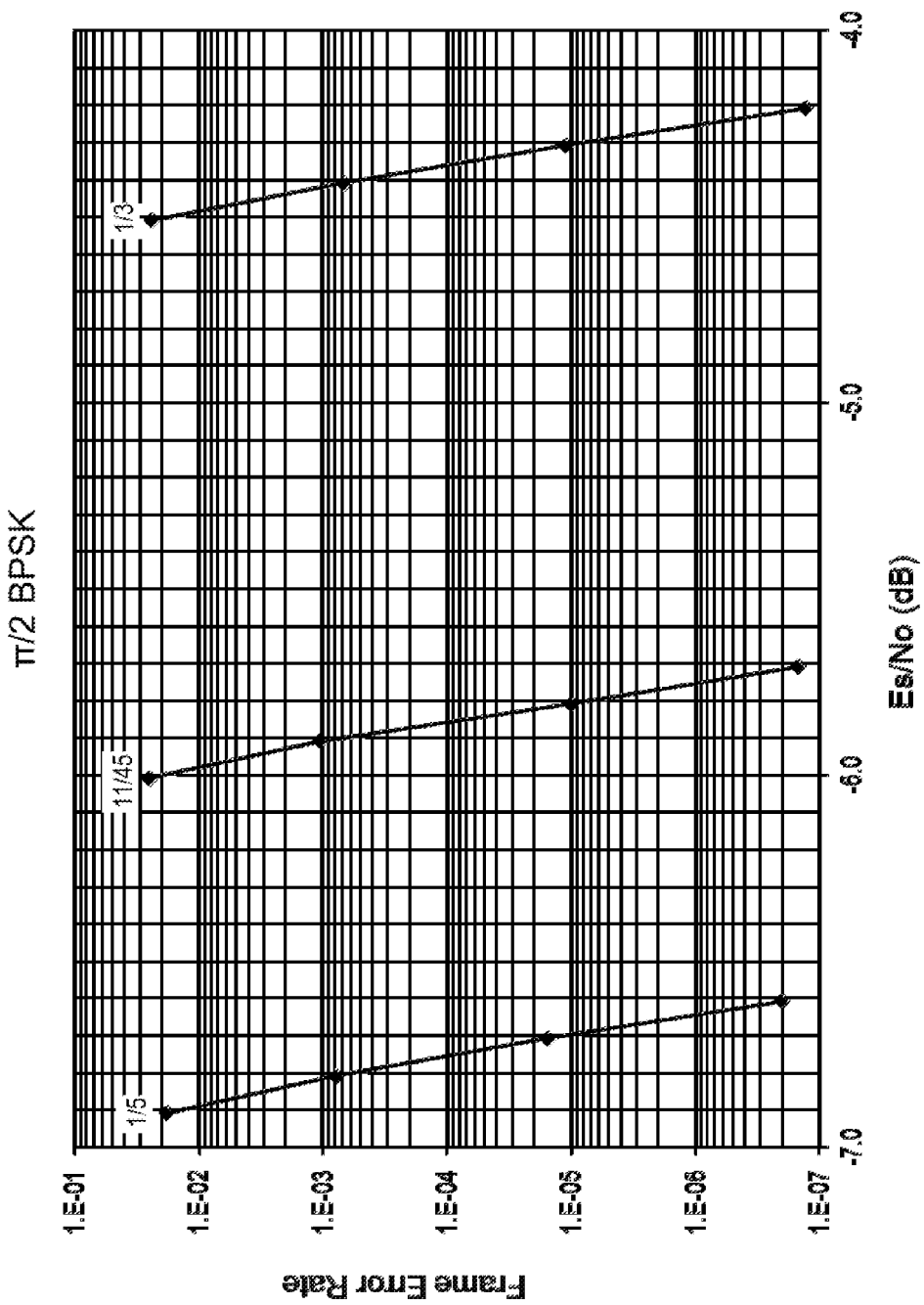
FIG. 5 illustrates simulated performance curves for the provided modulation and coding schemes over an AWGN channel, in accordance with exemplary embodiments of the present invention.

FIG. 5 illustrates simulated performance curves for the provided modulation and coding schemes (listed above in Table 5) over an AWGN channel, in accordance with exemplary embodiments of the present invention.

Figure 6:
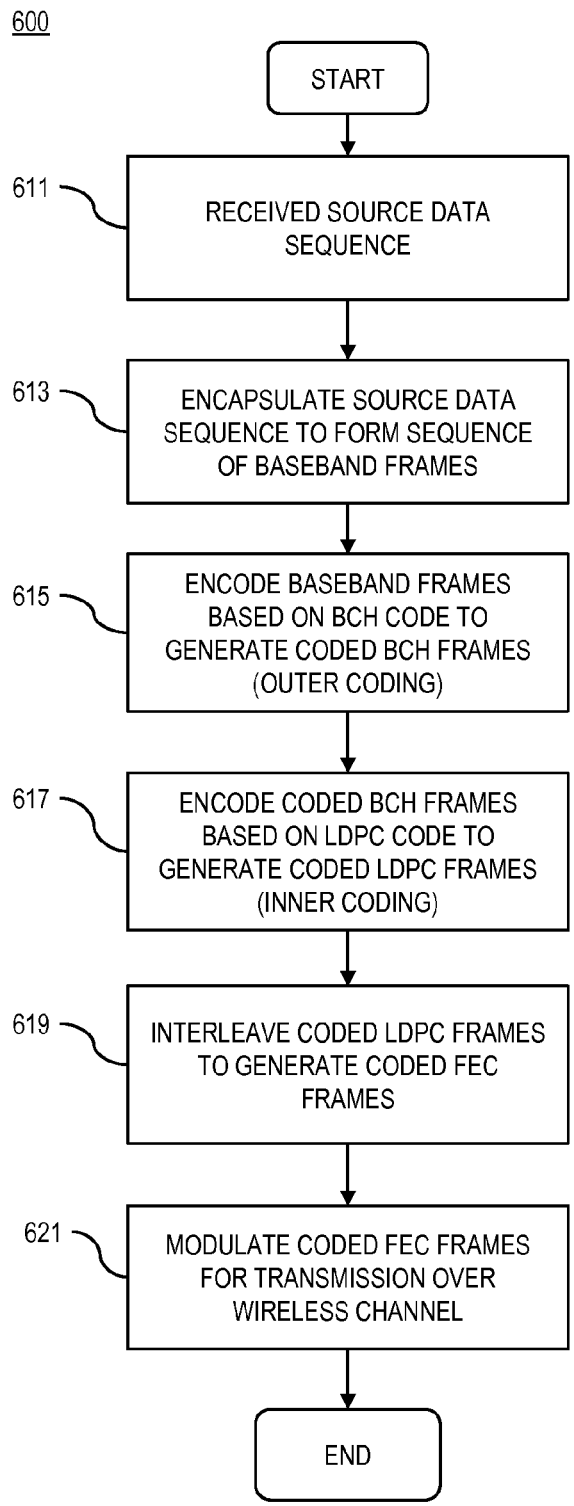
FIG. 6 illustrates a flow chart of an exemplary process for encoding and modulating a source data sequence of information bits, in accordance with exemplary embodiments of the present invention.

FIG. 6 illustrates a flow chart of the encoding and modulation processes described above, in accordance with exemplary embodiments of the present invention. For example, the encoding and modulation process 600 may be performed by a transmitter 210 as depicted in FIG. 2A. With reference to FIG. 6, the process starts at step 611, where a source data sequence is received, for example, by the data encapsulation module 211. At step 613, the encapsulation module encapsulates the source data sequence to form a sequence of baseband frames. At step 615, the BCH encoder 213a encodes the baseband frames in accordance with a t-error BCH code to generate respective coded BCH data frames. At step 617, the LDPC encoder 213b encodes the coded BCH data frames in accordance with a structured LDPC code to generate coded LDPC data frames. At step 619 (if interleaving is applied), the bit interleaver 213c interleaves the coded bits of the coded LDPC data frames to generate coded FEC frames. At step 621 the modulator 215 modulates the coded FEC frames in accordance with a selected modulation scheme for transmission over the wireless satellite channel 114.

Figure 7:
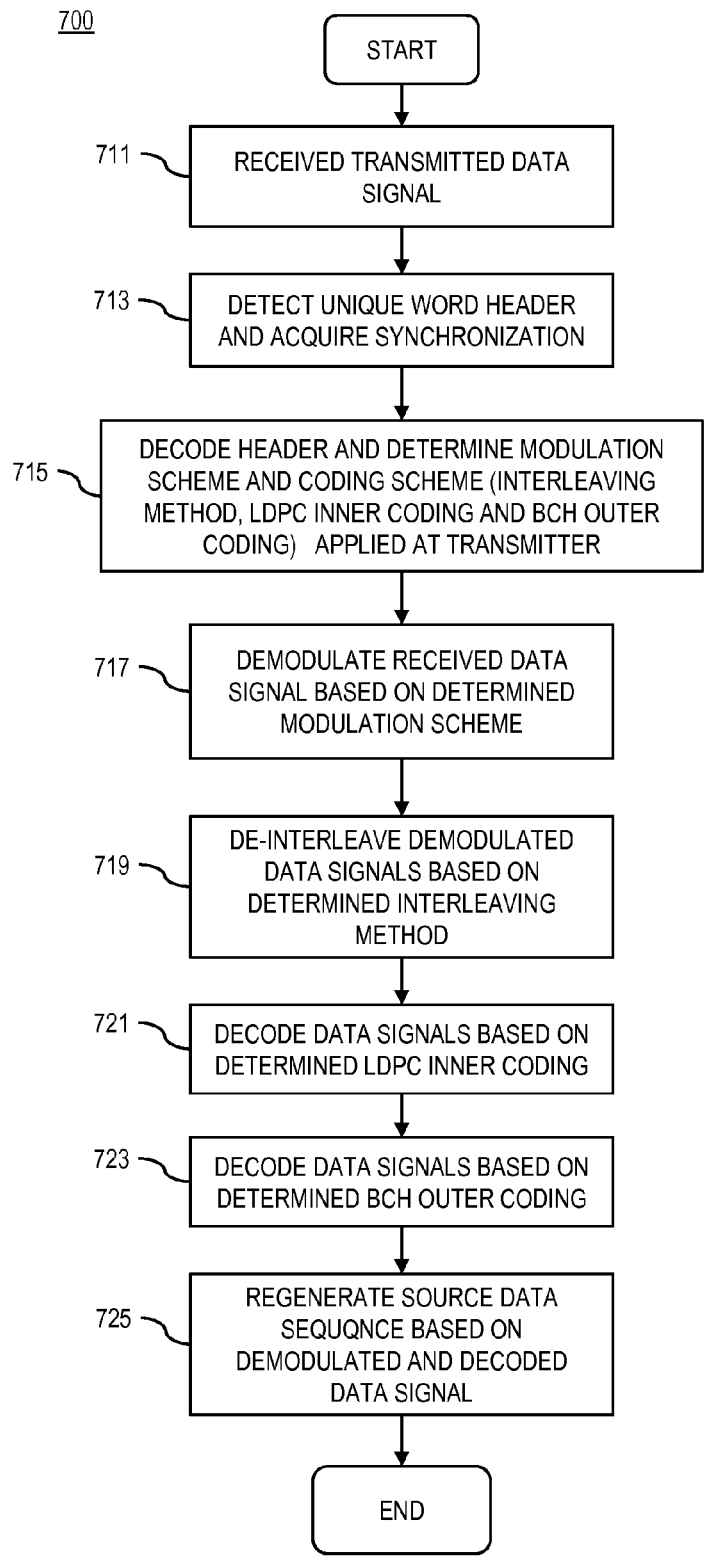
FIG. 7 illustrates a flow chart of an exemplary process for demodulating and decoding a received data signal transmission to replicate a source data sequence of information bits that was encoded and modulated, in accordance with exemplary embodiments of the present invention.

FIG. 7 illustrates a flow chart of an exemplary process for demodulating and decoding a received data signal transmission to replicate a source data sequence of information bits that was encoded and modulated as described above, in accordance with exemplary embodiments of the present invention. For example, the decoding and demodulation process 700 may be performed by a receiver 220 as depicted in FIG. 2B. With reference to FIG. 7, the process starts at step 711, where the data signals transmitted over the satellite channel 114 are received by the receiver 220. At step 713, the sync module 227 detects the unique word and acquires synchronization. At step 715, the receiver decodes header information to determine the modulation scheme and coding scheme (e.g., the interleaving method—if applied, LDPC inner coding and BCH outer coding applied at the transmitter). The decoding of the header information, for example, may be performed by the sync module 227 or the decoder module 223 (or by another module of the receiver configured to perform such header decoding—not shown in FIG. 2B). At step 717, the demodulator 225 demodulates the received data signals based on the determined modulation scheme to generate a received replica of the transmitted FEC frames. At step 719 (if interleaving was applied in the encoding), the decoder 223 de-interleaves the demodulated data frames based on the determined interleaving method. At step 721, the decoder 723 decodes the de-interleaved data based on the determined LDPC inner coding. At step 723, the decoder 223 further decodes the data frames based on the determined BCH outer coding. Then at step 725, the data de-encapsulation module de-encapsulates the decoded data frames to generate a replica of the original source data sequence.

FIG. 8 illustrates a block diagram of a chip set that can be utilized in implementing communications system protocols, according to exemplary embodiments of the present invention. With reference to FIG. 8, chip set 800 includes, for instance, processor and memory components described with respect to FIG. 5 incorporated in one or more physical packages. By way of example, a physical package includes an arrangement of one or more materials, components, and/or wires on a structural assembly (e.g., a baseboard) to provide one or more characteristics such as physical strength, conservation of size, and/or limitation of electrical interaction.

In one embodiment, the chip set 800 includes a communication mechanism such as a bus 801 for passing information among the components of the chip set. A processor 803 has connectivity to the bus 801 to execute instructions and process information stored in, for example, a memory 805. The processor 803 includes one or more processing cores with each core configured to perform independently. A multi-core processor enables multiprocessing within a single physical package. Examples of a multi-core processor include two, four, eight, or greater numbers of processing cores. Alternatively or in addition, the processor 503 includes one or more microprocessors configured in tandem via the bus 801 to enable independent execution of instructions, pipelining, and multithreading. The processor 803 may also be accompanied with one or more specialized components to perform certain processing functions and tasks such as one or more digital signal processors (DSP) 807, and/or one or more application-specific integrated circuits (ASIC) 809. A DSP 807 typically is configured to process real-world signals (e.g., sound) in real time independently of the processor 803. Similarly, an ASIC 809 can be configured to performed specialized functions not easily performed by a general purposed processor. Other specialized components to aid in performing the inventive functions described herein include one or more field programmable gate arrays (FPGA) (not shown), one or more controllers (not shown), or one or more other special-purpose computer chips.

The processor 803 and accompanying components have connectivity to the memory 805 via the bus 801. The memory 805 may comprise various forms of computer-readable media, e.g., including both dynamic memory (e.g., RAM) and static memory (e.g., ROM) for storing executable instructions that, when executed by the processor 803 and/or the DSP 807 and/or the ASIC 809, perform the process of exemplary embodiments as described herein. The memory 805 also stores the data associated with or generated by the execution of the process.

The term "computer-readable medium" or "computer-readable media," as used herein, refers to any medium that participates in providing instructions for execution by the processor 803, and/or one or more of the specialized components, such as the one or more digital signal processors (DSP) 807, and/or one or more application-specific integrated circuits (ASIC) 809. Such a medium may take many forms, including but not limited to non-volatile media, volatile media, and transmission media. Non-volatile media include, for example, read only memory (ROM), included within memory 805. Volatile media, for example, may include dynamic random access memory (RAM), included within memory 805. Transmission media may include copper or other conductive wiring, fiber optics, or other physical transmission media, including the wires and/or optical fiber that comprise bus 801. Transmission media can also take the form of wireless data signals, such as those generated during radio frequency (RF) and infrared (IR) data communications. Common forms of computer-readable media include, for example, magnetic storage media (e.g., magnetic hard disks or any other magnetic storage medium), solid state or semiconductor storage media (e.g., RAM, PROM, EPROM, FLASH EPROM, a data storage device that uses integrated circuit assemblies as memory to store data persistently, or any other storage memory chip or module), optical storage media (e.g., CD ROM, CDRW, DVD, or any other optical storage medium), a or any other medium for storing data from which a computer or processor can read.

Various forms of computer-readable media may be involved in providing instructions to a processor for execution. For example, the instructions for carrying out at least part of the present invention may initially be borne on a magnetic disk of a remote computer. In such a scenario, the remote computer loads the instructions into main memory and sends the instructions over a telephone line using a modem. A modem of a local computer system receives the data on the telephone line and uses an infrared transmitter to convert the data to an infrared signal and transmit the infrared signal to a portable computing device, such as a personal digital assistance (PDA) and a laptop. An infrared detector on the portable computing device receives the information and instructions borne by the infrared signal and places the data on a bus. The bus conveys the data to main memory, from which a processor retrieves and executes the instructions. The instructions received by main memory may optionally be stored on storage device either before or after execution by processor.

Moreover, as will be appreciated, a module or component (as referred to herein) may be composed of software component(s), which are stored in a memory or other computer-readable storage medium, and executed by one or more processors or CPUs of the respective devices. As will also be appreciated, however, a module may alternatively be composed of hardware component(s) or firmware component(s), or a combination of hardware, firmware and/or software components. Further, with respect to the various exemplary embodiments described herein, while certain of the functions are described as being performed by certain components or modules (or combinations thereof), such descriptions are provided as examples and are thus not intended to be limiting. Accordingly, any such functions may be envisioned as being performed by other components or modules (or combinations thereof), without departing from the spirit and general scope of the present invention.

While exemplary embodiments of the present invention may provide for various implementations (e.g., including hardware, firmware and/or software components), and, unless stated otherwise, all functions are performed by a CPU or a processor executing computer executable program code stored in a non-transitory memory or computer-readable storage medium, the various components can be implemented in different configurations of hardware, firmware, software, and/or a combination thereof. Except as otherwise disclosed herein, the various components shown in outline or in block form in the figures are individually well known and their internal construction and operation are not critical either to the making or using of this invention or to a description of the best mode thereof.

In the preceding specification, various embodiments have been described with reference to the accompanying drawings. It will, however, be evident that various modifications may be made thereto, and additional embodiments may be implemented, without departing from the broader scope of the invention as set forth in the claims that follow. The specification and drawings are accordingly to be regarded in an illustrative rather than restrictive sense.

What is claimed is:

1. A method comprising:
encoding, by a processor of a device, a source data sequence of information bits based on a predetermined structured parity check matrix of a Low Density Parity Check (LDPC) code, wherein the encoding is performed based on frames of the source data sequence, each frame being of a length of $k_{ldpc}$ information bits ($i_0, i_1, \ldots, i_{k_{ldpc}-1}$), and the output of the encoding comprises coded LDPC frames each being $n_{ldpc}$ coded bits in length, and wherein the structured parity check matrix is represented by tabular information of a format wherein each row represents occurrences of one values within a respective column of the parity check matrix, and the columns of the parity check matrix are derived according to a predetermined operation based on the respective rows of the tabular information, and wherein the tabular information comprises a one of Tables 1a through 1c (below);
wherein the encoding comprises generating $n_{ldpc}-k_{ldpc}$ parity bits ($p_0, p_1, \ldots, p_{n_{ldpc}-k_{ldpc}-1}$) for each frame of the source data sequence, wherein the generation of the parity bits comprises:
initializing parity bit accumulators for $p_0, p_1, \ldots, p_{n_{ldpc}-k_{ldpc}-1}$ to zero;
accumulating information bit $i_0$ at parity bit accumulator addresses specified in the first row of the table;
for the next group of m−1 information bits, $i_y$ (y=1, 2, \ldots, m−1), accumulating each information bit at parity bit accumulator addresses $\{x+(y \bmod m)*q\} \bmod(n_{ldpc}-k_{ldpc})$, wherein x denotes an address of a parity bit accumulator corresponding to the information bit $i_0$, and q is a code-rate dependent constant ($q=(n_{ldpc}-k)/m$), and wherein m is a code-dependent constant and k=R*n (where R is the code rate);
accumulating $i_m$ at parity bit accumulator addresses specified in the second row of the table, and, in a similar manner as for the group of m−1 information bits (above), accumulating each information bit of the next group of m−1 information bits $i_z$, z=(m+1, m+2, \ldots, 2m) at $\{x+(z \bmod m)*q\} \bmod(n_{ldpc}-k_{ldpc})$, wherein x denotes the address of the parity bit accumulator corresponding to the information bit $i_m$ (the entries of the second row of the table);
in a similar manner, for each subsequent group of m information bits, accumulating the information bits at parity bit addresses based on a next row of the table; and after all of the information bits of the frame are accumulated, performing operations according to $p_i=p_i \oplus p_{i-1}$, wherein for i=1, 2, \ldots, ($n_{ldpc}-k_{ldpc}-1$), each $p_i$ resulting from the operation for a given i is equal to the parity bit $p_i$;

TABLE 1a

Address of Parity Bit Accumulators (Rate 1/5) ($n_{ldpc}$ = 32400)

18222 6715 4908 21568 22821 11708 4769 4495 22243 25872 9051 19072 13956
2038 5205 21215 21009 9584 2403 23652 20866 20130 677 9509 6136 773
19936 14590 17829 473 4432 23171 11386 17937 22084 24450 267 8822 19335
16376 16769 5111 9794 18907 827 12385 12370 21647 10938 23619 11633 15865
23417 7631 12243 21546 4192 22117 14757 4118 9686 17021 8531 15989 8807
15533 16584 18529 19699 17821 4252 1254 5952 3163 20295 6944 1022 19743
129 16579 23524 25897 14690 11222 16250 9925 4268 999 7102 24528 152
18361 3708 3454 16604 1551 5809 20324 4775 22418 19091 19674 10975 7327
24133 10950 22779 11388 13818 20668 7556 12333 16446 19684 12510 25118 8162
17026 6850 1269
21895 7137 25270
11858 24153 13303
7885 16438 12805
10473 15004 8052
2088 10379 10067
21438 13426 10440
17696 727 12164
22623 8408 17849

TABLE 1b

Address of Parity Bit Accumulators (Rate 11/45) ($n_{ldpc}$ = 32400)

20617 6867 14845 11974 22563 190 17207 4052 7406 16007
21448 14846 2543 23380 16633 20365 16869 13411 19853 795
5200 2330 2775 23620 20643 10745 14742 6493 14222 20939
9445 9523 12769 7332 21792 18717 16397 14016 9481 22162
2922 6427 4497 4116 17658 2581 14364 3781 18851 22974
10383 2184 1433 3889 12828 17424 17580 20936 1390 21374
425 2063 22398 20907 9445 14790 4457 723 7048 4072
11771 9640 23212 9613 12042 8335 21386 20129 13521 16301
14867 12501 1086 21526 17701 17731 20907 8790 19224 5784
7107 19690 17616 5800 9501 23320 16878 794 15931 17539
4556 21783 1524
20100 11706 23663
2535 15530 6116
12078 3867 2663
19629 20246 7024
11748 11426 19802
15942 12333 5316
11521 3170 17818
2289 23780 16575
6649 16991 13025
20050 10619 10250
3944 13063 5656

TABLE 1c

Address of Parity Bit Accumulators (Rate 1/3) ($n_{ldpc}$ = 32400)

7416 4093 16722 1023 20586 12219 9175 16284 1554 10113 19849 17545
13140 3257 2110 13888 3023 1537 1598 15018 18931 13905 10617 1014
339 14366 3309 15360 18358 3196 4412 6023 7070 17380 2777 6691
12720 17634 4141 1400 8247 18201 16077 11314 11928 3494 3155 2865
21038 6928 3860 1943 20292 6526 12939 15182 3957 5651 356 2673
20555 17905 5724 13932 1218 17763 5912 5164 6233 6220 1277 19209
19190 4498 4950 6645 5482 5667 13701 16334 15231 735 8589 12344

TABLE 1c-continued

Address of Parity Bit Accumulators (Rate 1/3) ($n_{ldpc}$ = 32400)

679 17849 17807 16033 10181 3368 5778 8275 2736 14042 17506 6005
1576 10259 10525 3007 16522 697 7726 8641 14323 2893 8168 11070
17270 10180 18740 847 4969 14715 19316 5530 17428 11193 9861 13562
6156 18787 10467
2422 3723 10769
8015 18716 13406
5969 15949 3084
6855 13990 3764
10351 15779 10392
16078 19034 11279
11747 6608 4188
19699 8928 8045
4598 7219 11391
19766 11871 5692
7487 15905 17621
8554 7751 16516
4981 20250 16146
12524 21364 10793
17083 2051 8862
1315 6246 7721
18043 16652 5502
1432 5674 2224
11257 1312 8453.

2. The method of claim 1, wherein the LDPC code is of a structure that facilitates use of a plurality of parallel engines for decoding the coded signal.

3. The method of claim 1, wherein $n_{ldpc}$=32400, and m=360.

4. The method of claim 1, further comprising:
modulating the coded LDPC frames according to according to one of the following modulation types: π/2 BPSK (Binary Phase Shift Keying) and QPSK (Quadrature Phase Shift Keying).

5. The method of claim 1, wherein the source data sequence is segmented into a series of baseband frames, and the method further comprises:
encoding each baseband frame based on a t-error Bose Chaudhuri Hocquenghem (BCH) code, wherein the BCH encoding comprises an outer coding and the LDPC encoding comprises an inner coding.

6. The method of claim 5, wherein the BCH outer coding and the LDPC inner coding are based on a one row of the following table of coding parameters depending on the code rate:

| LDPC Code Identifier | BCH uncoded block $K_{BCH}$ | BCH coded block $N_{BCH}$ LDPC uncoded block $k_{ldpc}$ | BCH t-error correction | LDPC coded block $n_{ldpc}$ |
|---|---|---|---|---|
| 1/5 | 6300 | 6480 | 12 | 32400 |
| 11/45 | 7740 | 7920 | 12 | 32400 |
| 1/3 | 10620 | 10800 | 12 | 32400. |

7. The method of claim 6, wherein the BCH outer coding is further based on the following table of BCH polynomials:

| | |
|---|---|
| $g_1(x)$ | $1 + x^2 + x^3 + x^5 + x^{15}$ |
| $g_2(x)$ | $1 + x + x^4 + x^7 + x^{10} + x^{11} + x^{15}$ |
| $g_3(x)$ | $1 + x^2 + x^4 + x^6 + x^8 + x^{10} + x^{12} + x^{13} + x^{15}$ |
| $g_4(x)$ | $1 + x^2 + x^3 + x^5 + x^6 + x^8 + x^{10} + x^{11} + x^{15}$ |
| $g_5(x)$ | $1 + x + x^2 + x^4 + x^6 + x^7 + x^{10} + x^{12} + x^{15}$ |
| $g_6(x)$ | $1 + x^4 + x^6 + x^7 + x^{12} + x^{13} + x^{15}$ |
| $g_7(x)$ | $1 + x^2 + x^4 + x^5 + x^7 + x^{11} + x^{12} + x^{14} + x^{15}$ |
| $g_8(x)$ | $1 + x^2 + x^4 + x^6 + x^8 + x^9 + x^{11} + x^{14} + x^{15}$ |
| $g_9(x)$ | $1 + x + x^2 + x^4 + x^5 + x^7 + x^9 + x^{11} + x^{12} + x^{13} + x^{15}$ |
| $g_{10}(x)$ | $1 + x + x^2 + x^3 + x^4 + x^7 + x^{10} + x^{11} + x^{12} + x^{13} + x^{15}$ |
| $g_{11}(x)$ | $1 + x + x^2 + x^4 + x^9 + x^{11} + x^{15}$ |
| $g_{12}(x)$ | $1 + x^2 + x^4 + x^8 + x^{10} + x^{11} + x^{13} + x^{14} + x^{15}$. |

8. An apparatus, comprising:

at least one processor; and at least one memory including computer program code for one or more programs, the at least one memory and the computer program code configured to, with the at least one processor, cause the apparatus to perform at least the following:

encoding a source data sequence of information bits based on a predetermined structured parity check matrix of a Low Density Parity Check (LDPC) code, wherein the encoding is performed based on frames of the source data sequence, each frame being of a length of $k_{ldpc}$ information bits ($i_0, i_1, \ldots, i_{k_{ldpc}-1}$), and the output of the encoding comprises coded LDPC frames each being $n_{ldpc}$ coded bits in length, and wherein the structured parity check matrix is represented by tabular information of a format wherein each row represents occurrences of one values within a respective column of the parity check matrix, and the columns of the parity check matrix are derived according to a predetermined operation based on the respective rows of the tabular information, and wherein the tabular information comprises a one of Tables 8a through 8c (below);

wherein the encoding comprises generating $n_{ldpc}-k_{ldpc}$ parity bits ($p_0, p_1, \ldots, p_{n_{ldpc}-k_{ldpc}-1}$) for each frame of the source data sequence, wherein the generation of the parity bits comprises:

initializing parity bit accumulators for $p_0, p_1, \ldots, p_{n_{ldpc}-k_{ldpc}-1}$ to zero;

accumulating information bit $i_0$ at parity bit accumulator addresses specified in the first row of the table;

for the next group of m−1 information bits, $i_y$ (y=1, 2, . . . , m−1), accumulating each information bit at parity bit accumulator addresses {x+(y mod m)*q} mod($n_{ldpc}-k_{ldpc}$), wherein x denotes an address of a parity bit accumulator corresponding to the information bit $i_0$, and q is a code-rate dependent constant (q=($n_{ldpc}$−k)/m), and wherein m is a code-dependent constant and k=R*n (where R is the code rate);

accumulating $i_m$ at parity bit accumulator addresses specified in the second row of the table, and, in a similar manner as for the group of m−1 information bits (above), accumulating each information bit of the next group of m−1 information bits $i_z$, z=(m+1, m+2, . . . , 2m) at {x+(z mod m)*q} mod($n_{ldpc}-k_{ldpc}$), wherein x denotes the address of the parity bit accumulator corresponding to the information bit $i_m$ (the entries of the second row of the table);

in a similar manner, for each subsequent group of m information bits, accumulating the information bits at parity bit addresses based on a next row of the table; and after all of the information bits of the frame are accumulated, performing operations according to $p_i=p_i \oplus p_{i-1}$, wherein for i=1, 2, . . . , ($n_{ldpc}-k_{ldpc}-1$), each $p_i$ resulting from the operation for a given i is equal to the parity bit $p_i$;

TABLE 8a

Address of Parity Bit Accumulators (Rate 1/5) ($n_{ldpc}$ = 32400)

18222 6715 4908 21568 22821 11708 4769 4495 22243 25872 9051 19072 13956
2038 5205 21215 21009 9584 2403 23652 20866 20130 677 9509 6136 773
19936 14590 17829 473 4432 23171 11386 17937 22084 24450 267 8822 19335
16376 16769 5111 9794 18907 827 12385 12370 21647 10938 23619 11633 15865
23417 7631 12243 21546 4192 22117 14757 4118 9686 17021 8531 15989 8807
15533 16584 18529 19699 17821 4252 1254 5952 3163 20295 6944 1022 19743
129 16579 23524 25897 14690 11222 16250 9925 4268 999 7102 24528 152
18361 3708 3454 16604 1551 5809 20324 4775 22418 19091 19674 10975 7327
24133 10950 22779 11388 13818 20668 7556 12333 16446 19684 12510 25118 8162
17026 6850 1269
21895 7137 25270
11858 24153 13303
7885 16438 12805
10473 15004 8052
2088 10379 10067
21438 13426 10440
17696 727 12164
22623 8408 17849

TABLE 8b

Address of Parity Bit Accumulators (Rate 11/45) ($n_{ldpc}$ = 32400)

20617 6867 14845 11974 22563 190 17207 4052 7406 16007
21448 14846 2543 23380 16633 20365 16869 13411 19853 795
5200 2330 2775 23620 20643 10745 14742 6493 14222 20939
9445 9523 12769 7332 21792 18717 16397 14016 9481 22162
2922 6427 4497 4116 17658 2581 14364 3781 18851 22974
10383 2184 1433 3889 12828 17424 17580 20936 1390 21374
425 2063 22398 20907 9445 14790 4457 723 7048 4072
11771 9640 23212 9613 12042 8335 21386 20129 13521 16301
14867 12501 1086 21526 17701 17731 20907 8790 19224 5784
7107 19690 17616 5800 9501 23320 16878 794 15931 17539
4556 21783 1524
20100 11706 23663
2535 15530 6116
12078 3867 2663
19629 20246 7024
11748 11426 19802
15942 12333 5316
11521 3170 17818
2289 23780 16575
6649 16991 13025
20050 10619 10250
3944 13063 5656

TABLE 8c

Address of Parity Bit Accumulators (Rate 1/3) ($n_{ldpc}$ = 32400)

7416 4093 16722 1023 20586 12219 9175 16284 1554 10113 19849 17545
13140 3257 2110 13888 3023 1537 1598 15018 18931 13905 10617 1014
339 14366 3309 15360 18358 3196 4412 6023 7070 17380 2777 6691
12720 17634 4141 1400 8247 18201 16077 11314 11928 3494 3155 2865
21038 6928 3860 1943 20292 6526 12939 15182 3957 5651 356 2673
20555 17905 5724 13932 1218 17763 5912 5164 6233 6220 1277 19209
19190 4498 4950 6645 5482 5667 13701 16334 15231 735 8589 12344
679 17849 17807 16033 10181 3368 5778 8275 2736 14042 17506 6005
1576 10259 10525 3007 16522 697 7726 8641 14323 2893 8168 11070
17270 10180 18740 847 4969 14715 19316 5530 17428 11193 9861 13562
6156 18787 10467
2422 3723 10769
8015 18716 13406
5969 15949 3084
6855 13990 3764
10351 15779 10392
16078 19034 11279
11747 6608 4188
19699 8928 8045
4598 7219 11391
19766 11871 5692
7487 15905 17621
8554 7751 16516

TABLE 8c-continued

Address of Parity Bit Accumulators (Rate 1/3) ($n_{ldpc}$ = 32400)

4981 20250 16146
12524 21364 10793
17083 2051 8862
1315 6246 7721
18043 16652 5502
1432 5674 2224
11257 1312 8453.

9. The apparatus of claim 8, wherein the LDPC code is of a structure that facilitates use of a plurality of parallel engines for decoding the coded signal.

10. The apparatus of claim 8, wherein $n_{ldpc}$=32400, and m=360.

11. The apparatus of claim 8, wherein the apparatus is caused to further perform:

modulating the coded LDPC frames according to according to one of the following modulation types: π/2 BPSK (Binary Phase Shift Keying) and QPSK (Quadrature Phase Shift Keying).

12. The apparatus of claim 8, wherein the source data sequence is segmented into a series of baseband frames, and the apparatus is caused to further perform:

encoding each baseband frame based on a t-error Bose Chaudhuri Hocquenghem (BCH) code, wherein the BCH encoding comprises an outer coding and the LDPC encoding comprises an inner coding.

13. The apparatus of claim 12, wherein the BCH outer coding and the LDPC inner coding are based on a one row of the following table of coding parameters depending on the code rate:

| LDPC Code Identifier | BCH uncoded block $K_{BCH}$ | BCH coded block $N_{BCH}$ LDPC uncoded block $k_{ldpc}$ | BCH t-error correction | LDPC coded block $n_{ldpc}$ |
|---|---|---|---|---|
| 1/5 | 6300 | 6480 | 12 | 32400 |
| 11/45 | 7740 | 7920 | 12 | 32400 |
| 1/3 | 10620 | 10800 | 12 | 32400. |

14. The apparatus of claim 13, wherein the BCH outer coding is further based on the following table of BCH polynomials:

| | |
|---|---|
| $g_1(x)$ | $1 + x^2 + x^3 + x^5 + x^{15}$ |
| $g_2(x)$ | $1 + x + x^4 + x^7 + x^{10} + x^{11} + x^{15}$ |
| $g_3(x)$ | $1 + x^2 + x^4 + x^6 + x^8 + x^{10} + x^{12} + x^{13} + x^{15}$ |
| $g_4(x)$ | $1 + x^2 + x^3 + x^5 + x^6 + x^8 + x^{10} + x^{11} + x^{15}$ |
| $g_5(x)$ | $1 + x + x^2 + x^4 + x^6 + x^7 + x^{10} + x^{12} + x^{15}$ |
| $g_6(x)$ | $1 + x^4 + x^6 + x^7 + x^{12} + x^{13} + x^{15}$ |
| $g_7(x)$ | $1 + x^2 + x^4 + x^5 + x^7 + x^{11} + x^{12} + x^{14} + x^{15}$ |
| $g_8(x)$ | $1 + x^2 + x^4 + x^6 + x^8 + x^9 + x^{11} + x^{14} + x^{15}$ |
| $g_9(x)$ | $1 + x + x^2 + x^4 + x^5 + x^7 + x^9 + x^{11} + x^{12} + x^{13} + x^{15}$ |
| $g_{10}(x)$ | $1 + x + x^2 + x^3 + x^4 + x^7 + x^{10} + x^{11} + x^{12} + x^{13} + x^{15}$ |
| $g_{11}(x)$ | $1 + x + x^2 + x^4 + x^9 + x^{11} + x^{15}$ |
| $g_{12}(x)$ | $1 + x^2 + x^4 + x^8 + x^{10} + x^{11} + x^{13} + x^{14} + x^{15}.$ |

\* \* \* \* \*